(12) United States Patent
Lu et al.

(10) Patent No.: US 8,065,784 B2
(45) Date of Patent: Nov. 29, 2011

(54) APPARATUS FOR FORMING AN ELECTRICAL CONNECTION ON A SOLAR CELL

(75) Inventors: Danny Cam Toan Lu, San Francisco, CA (US); Yacov Elgar, Sunnyvale, CA (US); Jeffrey S. Sullivan, Castro Valley, CA (US); David Tanner, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 264 days.

(21) Appl. No.: 12/394,616

(22) Filed: Feb. 27, 2009

(65) Prior Publication Data

US 2009/0211071 A1 Aug. 27, 2009

Related U.S. Application Data

(60) Provisional application No. 61/032,005, filed on Feb. 27, 2008.

(51) Int. Cl.
*B23P 23/00* (2006.01)
(52) U.S. Cl. .............. 29/564; 29/564.1; 29/729; 29/739
(58) Field of Classification Search ............... 29/564, 29/564.1, 729, 739
See application file for complete search history.

(56) References Cited

U.S. PATENT DOCUMENTS

| | | | | |
|---|---|---|---|---|
| 4,773,944 A | * | 9/1988 | Nath et al. ................ 136/249 |
| 5,457,057 A | * | 10/1995 | Nath et al. ................ 438/67 |
| 5,607,097 A | * | 3/1997 | Sato et al. ................ 228/8 |
| 6,077,722 A | | 6/2000 | Jansen et al. |
| 6,256,549 B1 | | 7/2001 | Romero et al. |
| 6,265,242 B1 | * | 7/2001 | Komori et al. ................ 438/66 |
| 6,288,325 B1 | | 9/2001 | Jansen et al. |
| 6,423,565 B1 | * | 7/2002 | Barth et al. ................ 438/57 |
| 6,455,347 B1 | * | 9/2002 | Hiraishi et al. ................ 438/80 |
| 6,784,361 B2 | | 8/2004 | Carlson et al. |
| 6,803,513 B2 | * | 10/2004 | Beernink et al. ................ 136/244 |
| 6,841,728 B2 | | 1/2005 | Jones et al. |
| 6,858,461 B2 | * | 2/2005 | Oswald et al. ................ 438/68 |
| 7,432,438 B2 | | 10/2008 | Rubin et al. |
| 7,908,743 B2 | * | 3/2011 | Li et al. ................ 29/830 |
| 2003/0044539 A1 | * | 3/2003 | Oswald ................ 427/404 |
| 2003/0127128 A1 | | 7/2003 | Fabick et al. |
| 2003/0129810 A1 | | 7/2003 | Barth et al. |

(Continued)

FOREIGN PATENT DOCUMENTS

JP 2001-180822 A 7/2001

(Continued)

OTHER PUBLICATIONS

International Search Report and Written Opinion dated Nov. 10, 2010 for International Application No. PCT/US2010/030114.

(Continued)

*Primary Examiner* — Carl Arbes
(74) *Attorney, Agent, or Firm* — Patterson & Sheridan, L.L.P.

(57) ABSTRACT

Embodiments of the present invention provide a module and process for forming electrical connections on a solar cell substrate in a solar cell production line. The module generally provides a substrate handling system, a substrate positioning system, a cross-buss attachment assembly, and a side-buss attachment assembly. The module may provide adaptations for automatically adjusting the module to receive and process various sizes of solar cell substrates.

16 Claims, 9 Drawing Sheets

U.S. PATENT DOCUMENTS

| | | |
|---|---|---|
| 2005/0072455 A1 | 4/2005 | Gerhardinger et al. |
| 2005/0241692 A1 | 11/2005 | Rubin et al. |
| 2005/0252545 A1 | 11/2005 | Nowlan et al. |
| 2007/0056626 A1 | 3/2007 | Funcell |
| 2009/0077805 A1* | 3/2009 | Bachrach et al. ........ 29/890.033 |

FOREIGN PATENT DOCUMENTS

| | | |
|---|---|---|
| JP | 2004-153137 A | 5/2004 |
| JP | 2004-335680 A | 11/2004 |
| JP | 2005-235916 A | 9/2005 |
| JP | 2006-088511 A | 4/2006 |
| WO | WO-2009/029901 A1 | 3/2009 |
| WO | WO-2009/029902 A1 | 3/2009 |

OTHER PUBLICATIONS

Detlev Koch-Ospelt. "End-to-End Mass Production Solutions for Gen 1 & 2 Silicon Thin Film Modules". Power Point. Jun. 13, 2007.
International Search Report and Written Opinion dated Sep. 30, 2010 for PCT International Application No. PCT/US2009/035579.

* cited by examiner

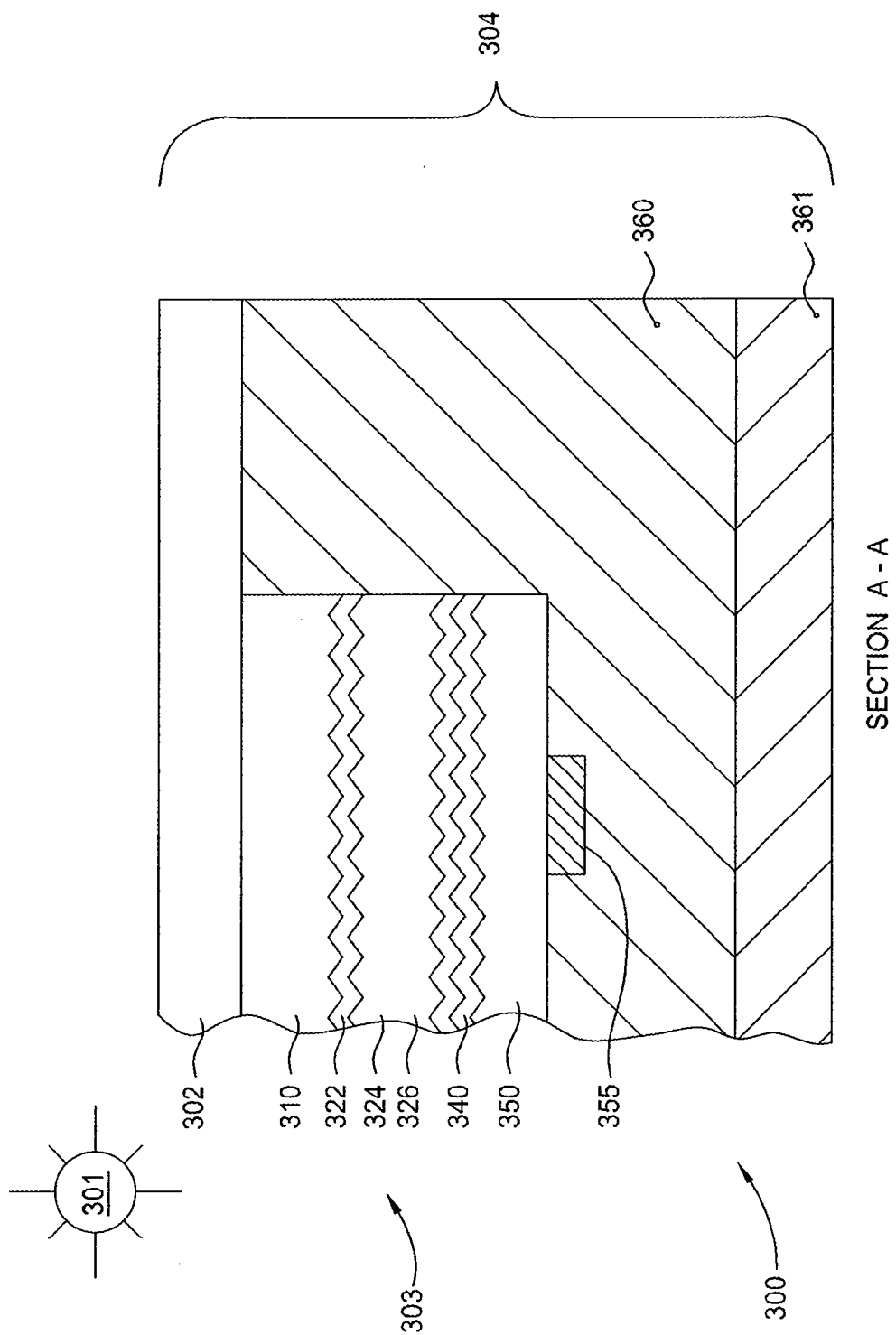

APPARATUS FOR FORMING AN ELECTRICAL CONNECTION ON A SOLAR CELL

CROSS-REFERENCE TO RELATED APPLICATIONS

This application claims benefit of U.S. provisional patent application Ser. No. 61/032,005, filed Feb. 27, 2008, which is herein incorporated by reference.

BACKGROUND OF THE INVENTION

1. Field of the Invention

Embodiments of the present invention generally relate to a method and apparatus for forming electrical connections on a solar cell in a production line.

2. Description of the Related Art

Photovoltaic (PV) devices or solar cells are devices which convert sunlight into direct current (DC) electrical power. Typical thin film type PV devices, or thin film solar cells, have one or more p-i-n junctions. Each p-i-n junction comprises a p-type layer, an intrinsic type layer, and an n-type layer. When the p-i-n junction of the solar cell is exposed to sunlight (consisting of energy from photons), the sunlight is converted to electricity through the PV effect. Solar cells may be tiled into larger solar arrays. The solar arrays are created by connecting a number of solar cells and joining them into panels with specific frames and connectors.

Typically, a thin film solar cell includes active regions, or photoelectric conversion units, and a transparent conductive oxide (TCO) film disposed as a front electrode and/or as a backside electrode. The photoelectric conversion unit includes a p-type silicon layer, an n-type silicon layer, and an intrinsic type (i-type) silicon layer sandwiched between the p-type and n-type silicon layers. Several types of silicon films, including microcrystalline silicon film (pc-Si), amorphous silicon film (a-Si), polycrystalline silicon film (poly-Si), and the like, may be utilized to form the p-type, n-type, and/or i-type layers of the photoelectric conversion unit. The backside electrode may contain one or more conductive layers. There is a need for an improved process of forming a solar cell that has good interfacial contact, low contact resistance, and high overall performance.

With traditional energy source prices on the rise, there is a need for a low cost way of producing electricity using a low cost solar cell device. Conventional solar cell manufacturing processes are highly labor intensive and have numerous interruptions that can affect the production line throughput, solar cell cost, and device yield. For instance, conventional solar cell electrical connection processes require formed electrical leads to be manually positioned and connected to the backside electrode of the solar cell device. These manual processes are labor intensive, time consuming and costly.

Additionally, as the size of solar cells increase, such as Generation 8 modules (2.2×2.6 meters modules), the connection of the electrical leads to the solar cell, especially in the center of the solar cell, becomes increasingly difficult for a technician to access and perform.

Therefore, there is a need for improved apparatus and processes for forming an electrical connection on a solar cell in an automated solar cell production line.

SUMMARY OF THE INVENTION

In one embodiment of the present invention, a bonding wire attach module comprises a substrate handling system having a conveyor system configured to receive a solar cell substrate into the bonding wire attach module and transfer the solar cell substrate out of the bonding wire attach module, a positioning system having a vision system comprising a camera, a cross-buss assembly having a motion assembly configured to receive commands from the system controller and position cross-buss material across a back contact surface of the solar cell substrate such that the cross-buss material is insulated from the back contact surface of the solar cell substrate, and a side-buss assembly configured to position and affix side-buss material to the back contact surface of the solar cell substrate along an edge region of the solar cell substrate. In one embodiment the vision system is configured to scan the solar cell substrate and send signals regarding the position of one or more features on the solar cell substrate to a system controller. In one embodiment, the side-buss material electrically connects the edge region of the solar cell substrate to a cross-buss wire.

In another embodiment, a bonding wire attach module comprises a substrate handling system having a plurality of conveyor belts configured to receive a solar cell substrate into the bonding wire attach module, advance the solar cell substrate within the bonding wire attach module, and transfer the solar cell substrate out of the bonding wire attach module, a positioning system having a vision system with at least one camera, a cross-buss assembly, and a side-buss assembly comprising two dispensing modules and two side-buss material depositing elements, wherein each side-buss material depositing element is configured to feed a respective length of side-buss material toward the back contact surface of the solar cell substrate and position the side-buss material along opposing edge regions of the solar cell substrate such that each length of side-buss material electrically connects the respective edge region of the solar cell substrate to the cross-buss material. In one embodiment, the vision system is configured to scan the solar cell substrate and send signals to a system controller regarding the position of one or more features on the solar cell substrate. In one embodiment, the cross-buss assembly comprises a material feed assembly configured to feed an insulating material toward a back contact surface of the solar cell substrate, a material dispense assembly configured to receive the insulating material from the material feed assembly and affix the insulating material to the back contact surface of the solar cell substrate, a cross-buss material feed assembly configured to feed the cross-buss material toward the back contact surface of the solar cell substrate, a cross-buss material dispense assembly configured to receive the cross-buss material from the cross-buss material feed assembly and affix the cross-buss material to the insulating material, and a motion assembly configured to receive commands from the system controller and position the material dispense assembly and the cross-buss material dispense assembly.

In yet another embodiment of the present invention, a method of forming an electrical connection on a solar cell comprises receiving a solar cell substrate onto a substrate handling system of a bonding wire attach module, sensing the position of the solar cell substrate on the substrate handling system, horizontally positioning the solar cell substrate with respect to at least one edge of the solar cell substrate, locating at least one feature on the solar cell substrate via a vision system comprising at least one camera, sending a signal from the vision system to a system controller, grasping the solar cell substrate with a gripping element and advancing the solar cell substrate into a cross-buss assembly region of the bonding wire attach module in response to commands received from the system controller, attaching cross-buss material to a back contact surface of the solar cell substrate in the cross-buss assembly region via commands received from the system controller, attaching side-buss material to the back contact surface along an edge region of the solar cell substrate in a side-buss assembly region of the bonding wire attach module via commands received from the system controller, wherein the side-buss material electrically connects the back contact surface of the solar cell substrate to the cross-buss material, and transferring the solar cell substrate out of the bonding wire attach module. In one embodiment, the cross-buss material is insulated from the back contact surface of the solar cell substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3D is a side cross-sectional view along Section A-A of FIG. 3C.

DETAILED DESCRIPTION

Embodiments of the present invention provide a module and process for forming electrical connections on a solar cell substrate in a solar cell production line. The module generally provides a substrate handling system, a substrate positioning system, a cross-buss attachment assembly, and a side-buss attachment assembly. The module may provide adaptations for automatically adjusting the module to receive and process various sizes of solar cell substrates.

Figure 1:
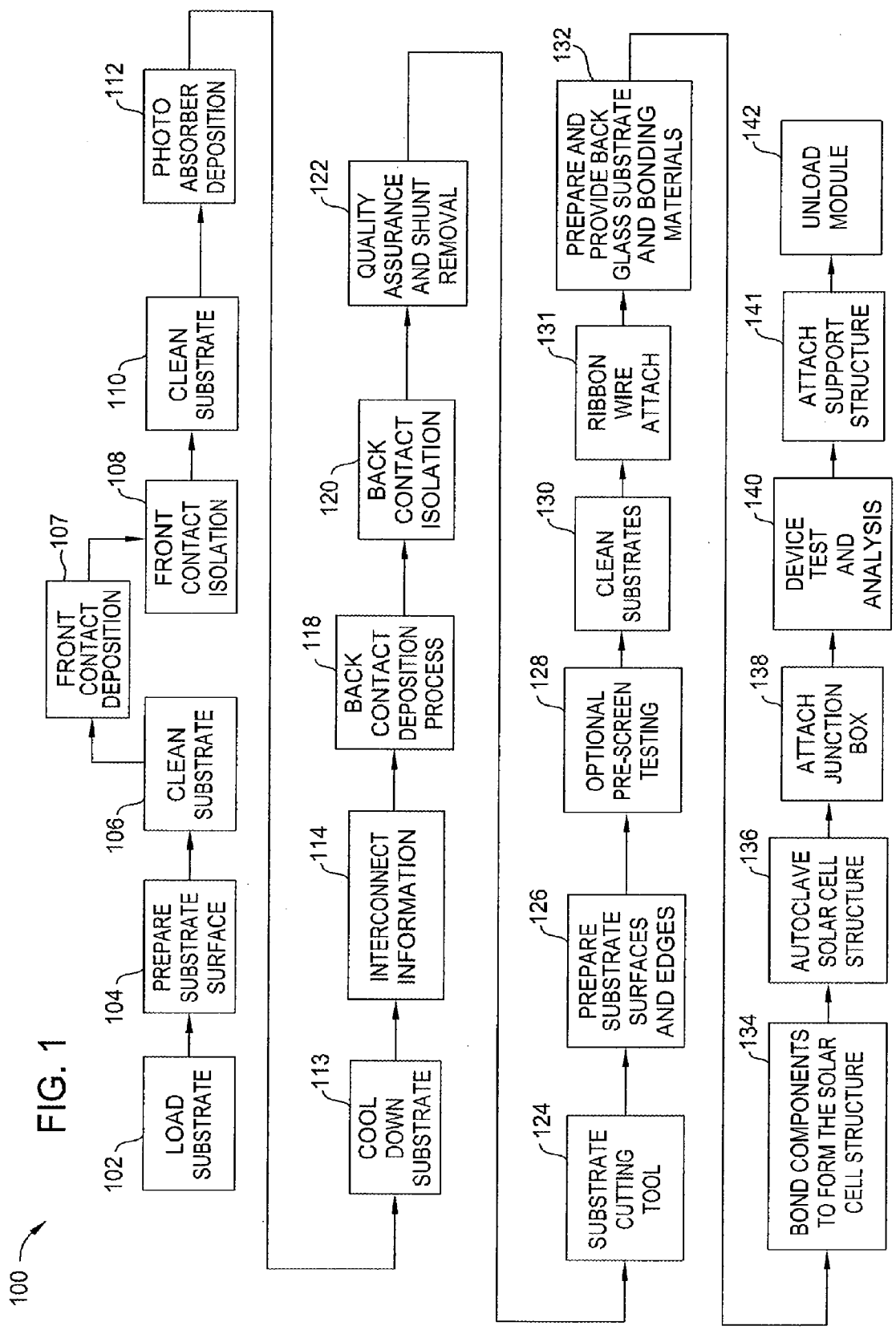
FIG. 1 illustrates a process sequence for forming a solar cell device according to one embodiment described herein.
Figure 2:
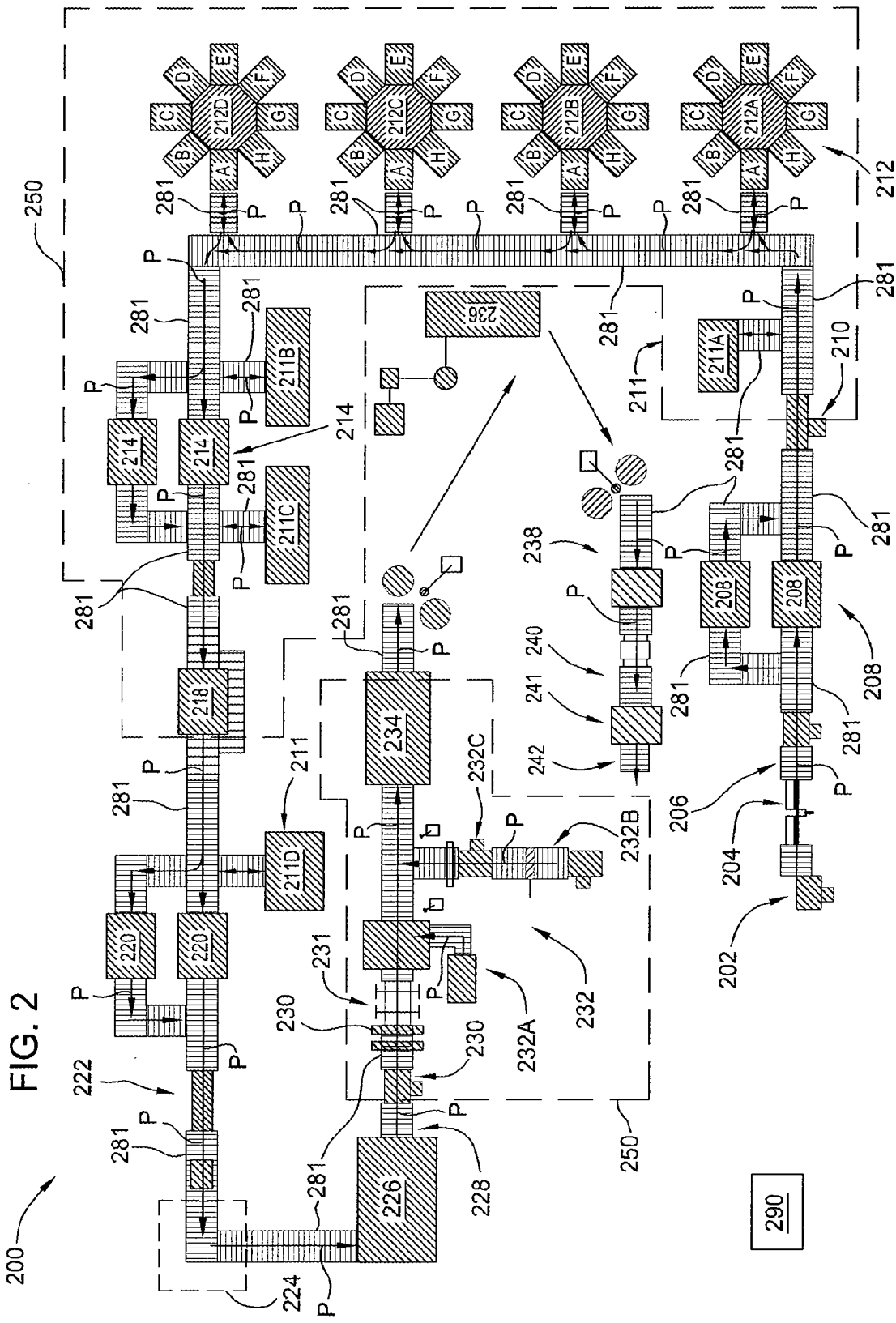
FIG. 2 illustrates a plan view of a solar cell production line according to one embodiment described herein.

FIG. 1 illustrates one embodiment of a process sequence 100 that contains a plurality of steps (i.e., steps 102-142) that are each used to form a solar cell device using a novel solar cell production line 200 described herein. The configuration, number of processing steps, and order of the processing steps in the process sequence 100 is not intended to be limiting to the scope of the invention described herein. FIG. 2 is a plan view of one embodiment of the production line 200, which is intended to illustrate some of the typical processing modules and process flows through the system and other related aspects of the system design, and is thus not intended to be limiting to the scope of the invention described herein.

A system controller 290 may be used to control one or more components found in the solar cell production line 200. The system controller 290 facilitates the control and automation of the overall solar cell production line 200 and typically includes a central processing unit (CPU) (not shown), memory (not shown), and support circuits (or I/O) (not shown). The CPU may be one of any form of computer processors that are used in industrial settings for controlling various system functions, substrate movement, chamber processes, and support hardware (e.g., sensors, robots, motors, lamps, etc.), and monitor the processes (e.g., substrate support temperature, power supply variables, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like.

A program (or computer instructions) readable by the system controller 290 determines which tasks are performable on a substrate. Preferably, the program is software readable by the system controller 290 that includes code to perform tasks relating to monitoring, moving, supporting, and/or positioning of a substrate along with various process recipe tasks and various chamber process recipe steps performed in the solar cell production line 200. In one embodiment, the system controller 290 also contains a plurality of programmable logic controllers (PLC's) that are used to locally control one or more modules in the solar cell production and a material handling system controller (e.g., PLC or standard computer) that deals with the higher level strategic moving, scheduling, and running of the complete solar cell production line.

Figure 3A:
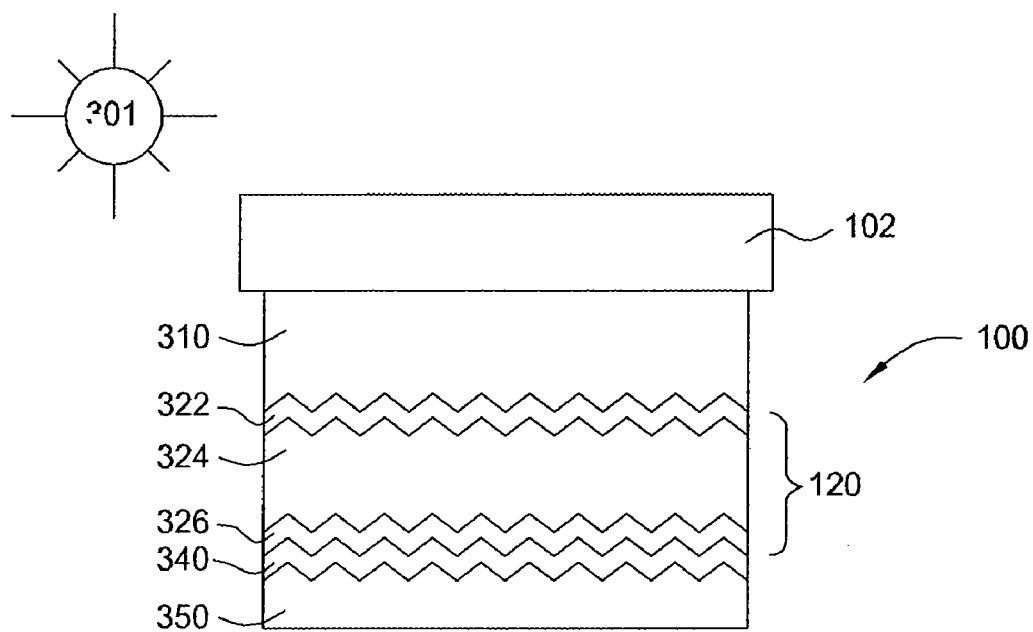
FIG. 3A is a side cross-sectional view of a thin film solar cell device according to one embodiment described herein.

Examples of a solar cell 300 that can be formed and tested using the process sequences illustrated in FIG. 1 and the components illustrated in the solar cell production line 200 are illustrated in FIGS. 3A-3E. FIG. 3A is a simplified schematic diagram of a single junction amorphous silicon solar cell 300 that can be formed and analyzed in the system described below.

As shown in FIG. 3A, the single junction amorphous silicon solar cell 300 is oriented toward a light source or solar radiation 301. The solar cell 300 generally comprises a substrate 302, such as a glass substrate, polymer substrate, metal substrate, or other suitable substrate, with thin films formed thereover. In one embodiment, the substrate 302 is a glass substrate that is about 2200 mm×2600 mm×3 mm in size. The solar cell 300 further comprises a first transparent conducting oxide (TCO) layer 310 (e.g., zinc oxide (ZnO), tin oxide (SnO)) formed over the substrate 302, a first p-i-n junction 320 formed over the first TCO layer 310, a second TCO layer 340 formed over the first p-i-n junction 320, and a back contact layer 350 formed over the second TCO layer 340. To improve light absorption by enhancing light trapping, the substrate and/or one or more of the thin films formed thereover may be optionally textured by wet, plasma, ion, and/or mechanical processes. For example, in the embodiment shown in FIG. 3A, the first TCO layer 310 is textured, and the subsequent thin films deposited thereover generally follow the topography of the surface below it.

In one configuration, the first p-i-n junction 320 may comprise a p-type amorphous silicon layer 322, an intrinsic type amorphous silicon layer 324 formed over the p-type amorphous silicon layer 322, and an n-type microcrystalline silicon layer 326 formed over the intrinsic type amorphous silicon layer 324. In one example, the p-type amorphous silicon layer 322 may be formed to a thickness between about 60 Å and about 300 Å, the intrinsic type amorphous silicon layer 324 may be formed to a thickness between about 1,500 Å and about 3,500 Å, and the n-type microcrystalline silicon layer 326 may be formed to a thickness between about 100 Å and about 400 Å. The back contact layer 350 may include, but is not limited to, a material selected from the group consisting of Al, Ag, Ti, Cr, Au, Cu, Pt, Ni, Mo, conductive carbon, alloys thereof, and combinations thereof.

Figure 3B:
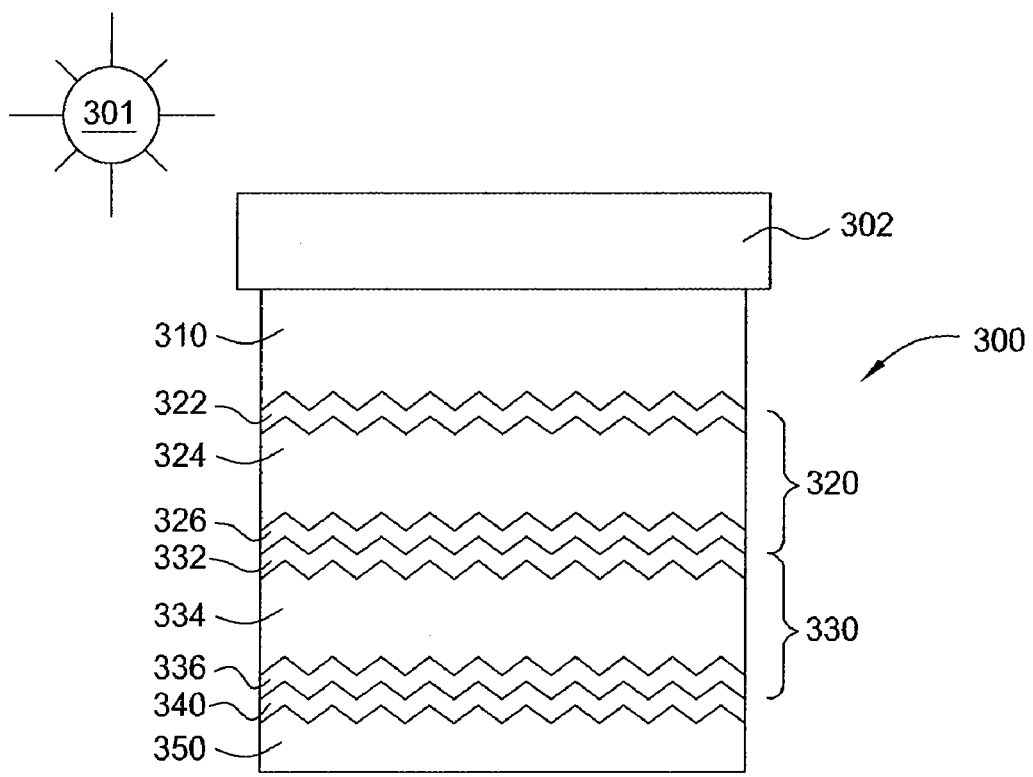
FIG. 3B is a side cross-sectional view of a thin film solar cell device according to one embodiment described herein.

FIG. 3B is a schematic diagram of an embodiment of a solar cell 300, which is a multi-junction solar cell that is oriented toward the light or solar radiation 301. The solar cell 300 comprises a substrate 302, such as a glass substrate, polymer substrate, metal substrate, or other suitable substrate, with thin films formed thereover. The solar cell 300 may further comprise a first transparent conducting oxide (TCO) layer 310 formed over the substrate 302, a first p-i-n junction 320 formed over the first TCO layer 310, a second p-i-n junction 330 formed over the first p-i-n junction 320, a second TCO layer 340 formed over the second p-i-n junction 330, and a back contact layer 350 formed over the second TCO layer 340.

In the embodiment shown in FIG. 3B, the first TCO layer 310 is textured, and the subsequent thin films deposited thereover generally follow the topography of the surface below it. The first p-i-n junction 320 may comprise a p-type amorphous silicon layer 322, an intrinsic type amorphous silicon layer 324 formed over the p-type amorphous silicon layer 322, and an n-type microcrystalline silicon layer 326 formed over the intrinsic type amorphous silicon layer 324. In one example, the p-type amorphous silicon layer 322 may be formed to a thickness between about 60 Å and about 300 Å, the intrinsic type amorphous silicon layer 324 may be formed to a thickness between about 1,500 Å and about 3,500 Å, and the n-type microcrystalline silicon layer 326 may be formed to a thickness between about 100 Å and about 400 Å.

The second p-i-n junction 330 may comprise a p-type microcrystalline silicon layer 332, an intrinsic type microcrystalline silicon layer 334 formed over the p-type microcrystalline silicon layer 332, and an n-type amorphous silicon layer 336 formed over the intrinsic type microcrystalline silicon layer 334. In one example, the p-type microcrystalline silicon layer 332 may be formed to a thickness between about 100 Å and about 400 Å, the intrinsic type microcrystalline silicon layer 334 may be formed to a thickness between about 10,000 Å and about 30,000 Å, and the n-type amorphous silicon layer 336 may be formed to a thickness between about 100 Å and about 500 Å. The back contact layer 350 may include, but is not limited to a material selected from the group consisting of Al, Ag, Ti, Cr, Au, Cu, Pt, Ni, Mo, conductive carbon, alloys thereof, and combinations thereof.

Figure 3C:
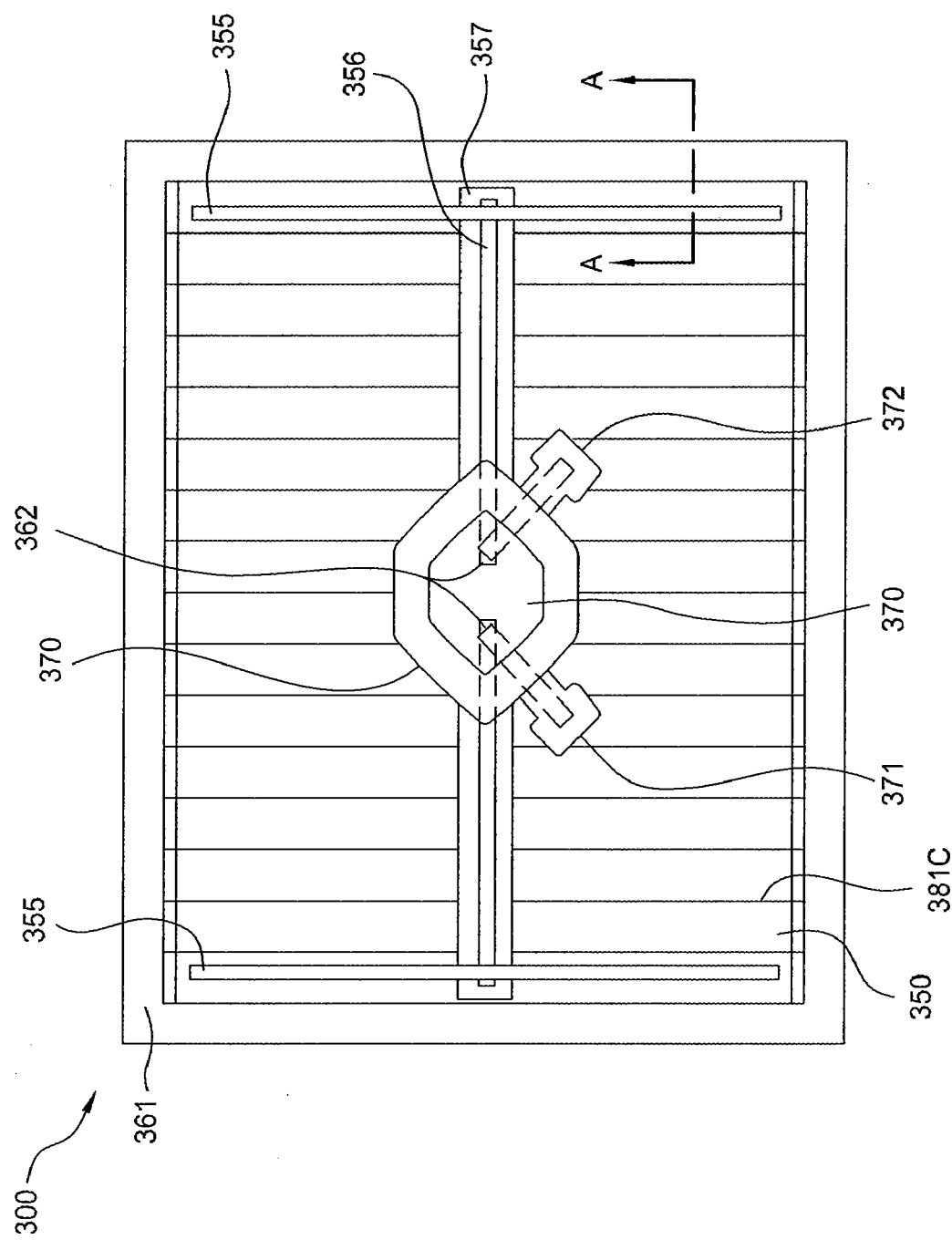
FIG. 3C is a plan view of a composite solar cell structure according to one embodiment described herein.

FIG. 3C is a plan view that schematically illustrates an example of the rear surface of a formed solar cell 300 that has been produced and tested in the production line 200. FIG. 3D is a side cross-sectional view of a portion of the solar cell 300 illustrated in FIG. 3C (see section A-A). While FIG. 3D illustrates the cross-section of a single junction cell similar to the configuration described in FIG. 3A, this is not intended to be limiting as to the scope of the invention described herein.

As shown in FIGS. 3C and 3D, the solar cell 300 may contain a substrate 302, the solar cell device elements (e.g., reference numerals 310-350), one or more internal electrical connections (e.g., side-buss 355, cross-buss 356), a layer of bonding material 360, a back glass substrate 361, and a junction box 370. The junction box 370 may generally contain two junction box terminals 371, 372 that are electrically connected to leads 362 of the solar cell 300 through the side-buss 355 and the cross-buss 356, which are in electrical communication with the back contact layer 350 and active regions of the solar cell 300. To avoid confusion relating to the actions specifically performed on the substrates 302 in the discussion below, a substrate 302 having one or more of the deposited layers (e.g., reference numerals 310-350) and/or one or more internal electrical connections (e.g., side-buss 355, cross-buss 356) disposed thereon is generally referred to as a device substrate 303. Similarly, a device substrate 303 that has been bonded to a back glass substrate 361 using a bonding material 360 is referred to as a composite solar cell structure 304.

Figure 3E:
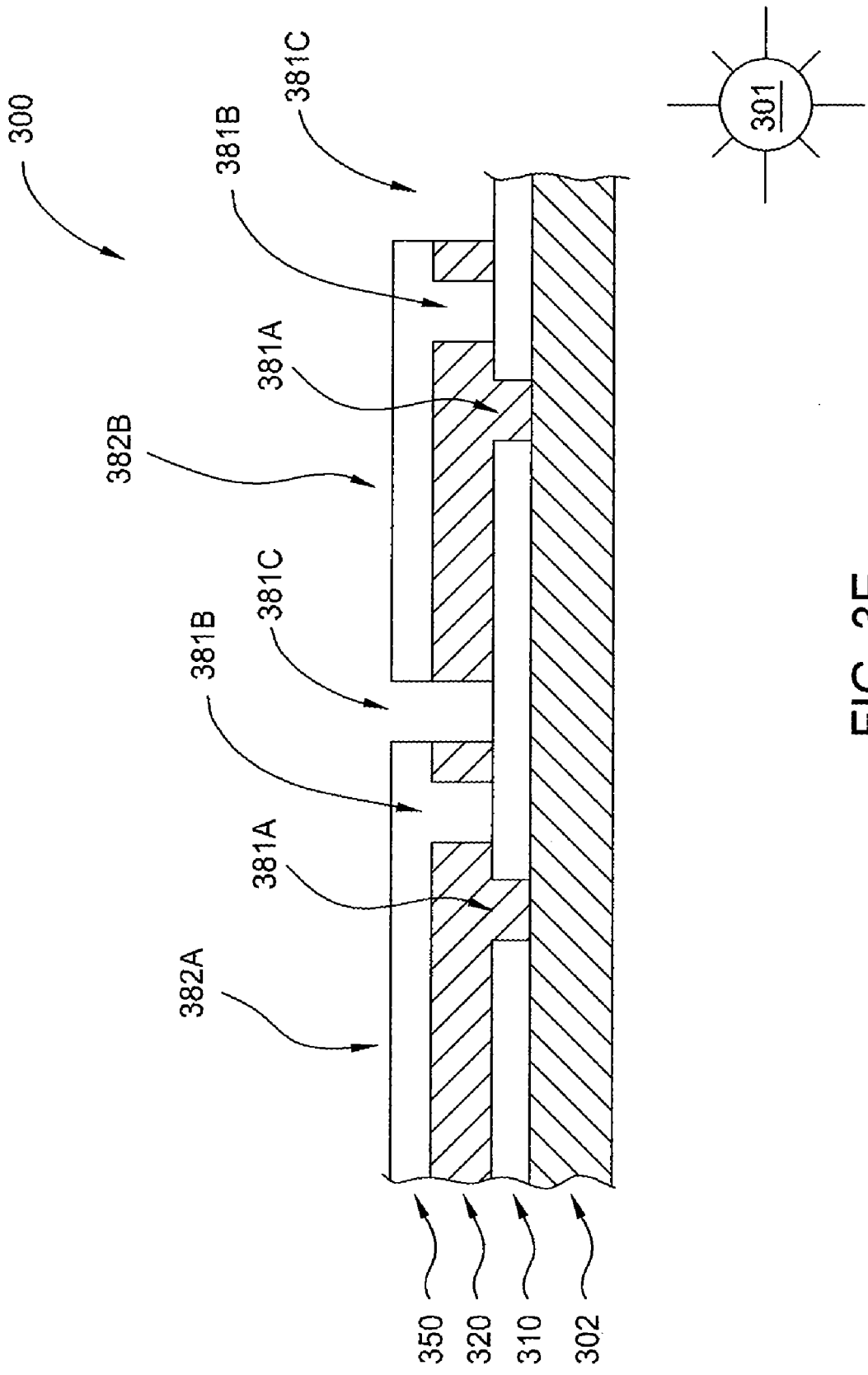
FIG. 3E is a side cross-sectional view of a thin film solar cell device according to one embodiment described herein.

FIG. 3E is a schematic cross-section of a solar cell 300 illustrating various scribed regions used to form the individual cells 382A-382B within the solar cell 300. As illustrated in FIG. 3E, the solar cell 300 includes a transparent substrate 302, a first TCO layer 310, a first p-i-n junction 320, and a back contact layer 350. Three laser scribing steps may be performed to produce trenches 381A, 381B, and 381C, which are generally required to form a high efficiency solar cell device. Although formed together on the substrate 302, the individual cells 382A and 382B are isolated from each other by the insulating trench 381C formed in the back contact layer 350 and the first p-i-n junction 320. In addition, the trench 381B is formed in the first p-i-n junction 320 so that the back contact layer 350 is in electrical contact with the first TCO layer 310. In one embodiment, the insulating trench 381A is formed by the laser scribe removal of a portion of the first TCO layer 310 prior to the deposition of the first p-i-n junction 320 and the back contact layer 350. Similarly, in one embodiment, the trench 381B is formed in the first p-i-n junction 320 by the laser scribe removal of a portion of the first p-i-n junction 320 prior to the deposition of the back contact layer 350. While a single junction type solar cell is illustrated in FIG. 3E this configuration is not intended to be limiting to the scope of the invention described herein.

General Solar Cell Formation Process Sequence

Referring to FIGS. 1 and 2, the process sequence 100 generally starts at step 102 in which a substrate 302 is loaded into the loading module 202 found in the solar cell production line 200. In one embodiment, the substrates 302 are received in a "raw" state where the edges, overall size, and/or cleanliness of the substrates 302 are not well controlled. Receiving "raw" substrates 302 reduces the cost to prepare and store substrates 302 prior to forming a solar device and thus reduces the solar cell device cost, facilities costs, and production costs of the finally formed solar cell device. However, typically, it is advantageous to receive "raw" substrates 302 that have a transparent conducting oxide (TCO) layer (e.g., first TCO layer 310) already deposited on a surface of the substrate 302 before it is received into the system in step 102. If a conductive layer, such as TCO layer, is not deposited on the surface of the "raw" substrates then a front contact deposition step (step 107), which is discussed below, needs to be performed on a surface of the substrate 302.

In one embodiment, the substrates 302 or 303 are loaded into the solar cell production line 200 in a sequential fashion, and thus do not use a cassette or batch style substrate loading system. A cassette style and/or batch loading type system that requires the substrates to be un-loaded from the cassette, processed, and then returned to the cassette before moving to the next step in the process sequence can be time consuming and decrease the solar cell production line throughput. The use of batch processing does not facilitate certain embodiments of the present invention, such as fabricating multiple solar cell devices from a single substrate. Additionally, the use of a batch style process sequence generally prevents the use of an asynchronous flow of substrates through the production line, which may provide improved substrate throughput during steady state processing and when one or more modules are brought down for maintenance or due to a fault condition. Generally, batch or cassette based schemes are not able to achieve the throughput of the production line described herein, when one or more processing modules are brought down for maintenance, or even during normal operation, since the queuing and loading of substrates can require a significant amount of overhead time.

In the next step, step 104, the surfaces of the substrate 302 are prepared to prevent yield issues later on in the process. In one embodiment of step 104, the substrate is inserted into a front end substrate seaming module 204 that is used to prepare the edges of the substrate 302 or 303 to reduce the likelihood of damage, such as chipping or particle generation from occurring during the subsequent processes. Damage to the substrate 302 or 303 can affect device yield and the cost to produce a usable solar cell device. In one embodiment, the front end seaming module 204 is used to round or bevel the edges of the substrate 302 or 303. In one embodiment, a diamond impregnated belt or disc is used to grind the material from the edges of the substrate 302 or 303. In another embodiment, a grinding wheel, grit blasting, or laser ablation technique is used to remove the material from the edges of the substrate 302 or 303.

Next the substrate 302 or 303 is transported to the cleaning module 206, in which step 106, or a substrate cleaning step, is performed on the substrate 302 or 303 to remove any contaminants found on the surface of thereof. Common contaminants may include materials deposited on the substrate 302 or 303 during the substrate forming process (e.g., glass manufacturing process) and/or during shipping or storing of the substrates 302 or 303. Typically, the cleaning module 206 uses wet chemical scrubbing and rinsing steps to remove any undesirable contaminants.

In one example, the process of cleaning the substrate 302 or 303 may occur as follows. First, the substrate 302 or 303 enters a contaminant removal section of the cleaning module 206 from either a transfer table or an automation device 281. In general, the system controller 290 establishes the timing for each substrate 302 or 303 that enters the cleaning module 206. The contaminant removal section may utilize dry cylindrical brushes in conjunction with a vacuum system to dislodge and extract contaminants from the surface of the substrate 302. Next, a conveyor within the cleaning module 206 transfers the substrate 302 or 303 to a pre-rinse section, where spray tubes dispense hot DI water at a temperature, for example, of 50° C. from a DI water heater onto a surface of the substrate 302 or 303. Commonly, since the device substrate 303 has a TCO layer disposed thereon, and since TCO layers are generally electron absorbing materials, DI water is used to avoid any traces of possible contamination and ionizing of the TCO layer. Next, the rinsed substrate 302, 303 enters a wash section. In the wash section, the substrate 302 or 303 is wet-cleaned with a brush (e.g., perlon) and hot water. In some cases a detergent (e.g., Alconox™, Citrajet™, Detojet™, Transene™, and Basic H™), surfactant, pH adjusting agent, and other cleaning chemistries are used to clean and remove unwanted contaminants and particles from the substrate surface. A water re-circulation system recycles the hot water flow. Next, in a final rinse section of the cleaning module 206, the substrate 302 or 303 is rinsed with water at ambient temperature to remove any traces of contaminants. Finally, in a drying section, an air blower is used to dry the substrate 302 or 303 with hot air. In one configuration a deionization bar is used to remove the electrical charge from the substrate 302 or 303 at the completion of the drying process.

In the next step, or step 108, separate cells are electrically isolated from one another via scribing processes. Contamination particles on the TCO surface and/or on the bare glass surface can interfere with the scribing procedure. In laser scribing, for example, if the laser beam runs across a particle, it may be unable to scribe a continuous line, resulting in a short circuit between cells. In addition, any particulate debris present in the scribed pattern and/or on the TCO of the cells after scribing can cause shunting and non-uniformities between layers. Therefore, a well-defined and well-maintained process is generally needed to ensure that contamination is removed throughout the production process. In one embodiment, the cleaning module 206 is available from the Energy and Environment Solutions division of Applied Materials in Santa Clara, Calif.

Referring to FIGS. 1 and 2, in one embodiment, prior to performing step 108 the substrates 302 are transported to a front end processing module (not illustrated in FIG. 2) in which a front contact formation process, or step 107, is performed on the substrate 302. In one embodiment, the front end processing module is similar to the processing module 218 discussed below. In step 107, the one or more substrate front contact formation steps may include one or more preparation, etching, and/or material deposition steps to form the front contact regions on a bare solar cell substrate 302. In one embodiment, step 107 comprises one or more PVD steps that are used to form the front contact region on a surface of the substrate 302. In one embodiment, the front contact region contains a transparent conducting oxide (TCO) layer that may contain metal element selected from a group consisting of zinc (Zn), aluminum (Al), indium (In), and tin (Sn). In one example, a zinc oxide (ZnO) is used to form at least a portion of the front contact layer. In one embodiment, the front end processing module is an ATON™ PVD 5.7 tool available from Applied Materials in Santa Clara, Calif. in which one or more processing steps are performed to deposit the front contact region. In another embodiment, one or more CVD steps are used to form the front contact region on a surface of the substrate 302.

Next the device substrate 303 is transported to the scribe module 208 in which step 108, or a front contact isolation step, is performed on the device substrate 303 to electrically isolate different regions of the device substrate 303 surface from each other. In step 108, material is removed from the device substrate 303 surface by use of a material removal step, such as a laser ablation process. The success criteria for step 108 are to achieve good cell-to-cell and cell-to-edge isolation while minimizing the scribe area.

In one embodiment, a Nd:vanadate (Nd:YVO$_4$) laser source is used ablate material from the device substrate 303 surface to form lines that electrically isolate one region of the device substrate 303 from the next. In one embodiment, the laser scribe process performed during step 108 uses a 1064 nm wavelength pulsed laser to pattern the material disposed on the substrate 302 to isolate each of the individual cells (e.g., reference cells 382A and 382B) that make up the solar cell 300. In one embodiment, a 5.7 m$^2$ substrate laser scribe module available from Applied Materials, Inc. of Santa Clara, Calif. is used to provide simple reliable optics and substrate motion for accurate electrical isolation of regions of the device substrate 303 surface. In another embodiment, a water jet cutting tool or diamond scribe is used to isolate the various regions on the surface of the device substrate 303.

It may be desirable to assure that the temperature of the device substrates 303 entering the scribe module 208 are at a temperature in a range between about 20° C. and about 26° C. by use of an active temperature control hardware assembly that may contain a resistive heater and/or chiller components (e.g., heat exchanger, thermoelectric device). In one embodiment, it is desirable to control the device substrate 303 temperature to about 25+/−0.5° C.

Next the device substrate 303 is transported to the cleaning module 210 in which step 110, or a pre-deposition substrate cleaning step, is performed on the device substrate 303 to remove any contaminants found on the surface of the device substrate 303 after performing the cell isolation step (step 108). Typically, the cleaning module 210 uses wet chemical scrubbing and rinsing steps to remove any undesirable contaminants found on the device substrate 303 surface after performing the cell isolation step. In one embodiment, a cleaning process similar to the processes described in step 106 above is performed on the device substrate 303 to remove any contaminants on the surface(s) of the device substrate 303.

Next, the device substrate 303 is transported to the processing module 212 in which step 112, which comprises one or more photoabsorber deposition steps, is performed on the device substrate 303. In step 112, the one or more photoabsorber deposition steps may include one or more preparation, etching, and/or material deposition steps that are used to form the various regions of the solar cell device. Step 112 generally comprises a series of sub-processing steps that are used to form one or more p-i-n junctions. In one embodiment, the one or more p-i-n junctions comprise amorphous silicon and/or microcrystalline silicon materials. In general, the one or more processing steps are performed in one or more cluster tools (e.g., cluster tools 212A-212D) found in the processing module 212 to form one or more layers in the solar cell device formed on the device substrate 303. In one embodiment, the device substrate 303 is transferred to an accumulator 211A prior to being transferred to one or more of the cluster tools 212A-212D. In one embodiment, in cases where the solar cell device is formed to include multiple junctions, such as the tandem junction solar cell 300 illustrated in FIG. 3B, the cluster tool 212A in the processing module 212 is adapted to form the first p-i-n junction 320 and cluster tools 212B-212D are configured to form the second p-i-n junction 330.

In one embodiment of the process sequence 100, a cool down step, or step 113, is performed after step 112 has been performed. The cool down step is generally used to stabilize the temperature of the device substrate 303 to assure that the processing conditions seen by each device substrate 303 in the subsequent processing steps are repeatable. Generally, the temperature of the device substrate 303 exiting the processing module 212 could vary by many degrees Celsius and exceed a temperature of 50° C., which can cause variability in the subsequent processing steps and solar cell performance.

In one embodiment, the cool down step 113 is performed in one or more of the substrate supporting positions found in one or more accumulators 211. In one configuration of the production line, as shown in FIG. 2, the processed device substrates 303 may be positioned in one of the accumulators 211B for a desired period of time to control the temperature of the device substrate 303. In one embodiment, the system controller 290 is used to control the positioning, timing, and movement of the device substrates 303 through the accumulator(s) 211 to control the temperature of the device substrates 303 before proceeding down stream through the production line.

Next, the device substrate 303 is transported to the scribe module 214 in which step 114, or the interconnect formation step, is performed on the device substrate 303 to electrically isolate various regions of the device substrate 303 surface from each other. In step 114, material is removed from the device substrate 303 surface by use of a material removal step, such as a laser ablation process. In one embodiment, an Nd:vanadate (Nd:YVO$_4$) laser source is used ablate material from the substrate surface to form lines that electrically isolate one solar cell from the next. In one embodiment, a 5.7 m$^2$ substrate laser scribe module available from Applied Materials, Inc. is used to perform the accurate scribing process. In one embodiment, the laser scribe process performed during step 108 uses a 532 nm wavelength pulsed laser to pattern the material disposed on the device substrate 303 to isolate the individual cells that make up the solar cell 300. As shown in FIG. 3E, in one embodiment, the trench 381B is formed in the first p-i-n junction 320 layers by use of a laser scribing process. In another embodiment, a water jet cutting tool or diamond scribe is used to isolate the various regions on the surface of the solar cell.

It may be desirable to assure that the temperature of the device substrates 303 entering the scribe module 214 are at a temperature in a range between about 20° C. and about 26° C. by use of an active temperature control hardware assembly that may contain a resistive heater and/or chiller components (e.g., heat exchanger, thermoelectric device). In one embodiment, it is desirable to control the substrate temperature to about 25+/−0.5° C.

In one embodiment, the solar cell production line 200 has at least one accumulator 211 positioned after the scribe module(s) 214. During production accumulators 211C may be used to provide a ready supply of substrates to the processing module 218, and/or provide a collection area where substrates coming from the processing module 212 can be stored if the processing module 218 goes down or can not keep up with the throughput of the scribe module(s) 214. In one embodiment it is generally desirable to monitor and/or actively control the temperature of the substrates exiting the accumulators 211C to assure that the results of the back contact formation step 120 are repeatable. In one aspect, it is desirable to assure that the temperature of the substrates exiting the accumulators 211C or arriving at the processing module 218 are at a temperature in a range between about 20° C. and about 26° C. In one embodiment, it is desirable to control the substrate temperature to about 25+/−0.5° C. In one embodiment, it is desirable to position one or more accumulators 211C that are able to retain at least about 80 substrates.

Next, the device substrate 303 is transported to the processing module 218 in which one or more substrate back contact formation steps, or step 118, are performed on the device substrate 303. In step 118, the one or more substrate back contact formation steps may include one or more preparation, etching, and/or material deposition steps that are used to form the back contact regions of the solar cell device. In one embodiment, step 118 generally comprises one or more PVD steps that are used to form the back contact layer 350 on the surface of the device substrate 303. In one embodiment, the one or more PVD steps are used to form a back contact region that contains a metal layer selected from a group consisting of zinc (Zn), tin (Sn), aluminum (Al), copper (Cu), silver (Ag), nickel (Ni), vanadium (V), molybdenum (Mo), and conductive carbon. In one example, a zinc oxide (ZnO) or nickel vanadium alloy (NiV) is used to form at least a portion of the back contact layer 305. In one embodiment, the one or more processing steps are performed using an ATON™ PVD 5.7 tool available from Applied Materials in Santa Clara, Calif. In another embodiment, one or more CVD steps are used to form the back contact layer 350 on the surface of the device substrate 303.

In one embodiment, the solar cell production line 200 has at least one accumulator 211 positioned after the processing module 218. During production, the accumulators 211D may be used to provide a ready supply of substrates to the scribe modules 220, and/or provide a collection area where substrates coming from the processing module 218 can be stored if the scribe modules 220 go down or can not keep up with the throughput of the processing module 218. In one embodiment it is generally desirable to monitor and/or actively control the temperature of the substrates exiting the accumulators 211D to assure that the results of the back contact formation step 120 are repeatable. In one aspect, it is desirable to assure that the temperature of the substrates exiting the accumulators 211D or arriving at the scribe module 220 are at a temperature in a range between about 20° C. and about 26° C. In one embodiment, it is desirable to control the substrate temperature to about 25+/−0.5° C. In one embodiment, it is desirable to position one or more accumulators 211C that are able to retain at least about 80 substrates.

Next, the device substrate 303 is transported to the scribe module 220 in which step 120, or a back contact isolation step, is performed on the device substrate 303 to electrically isolate the plurality of solar cells contained on the substrate surface from each other. In step 120, material is removed from the substrate surface by use of a material removal step, such as a laser ablation process. In one embodiment, a Nd:vanadate (Nd:YVO$_4$) laser source is used ablate material from the device substrate 303 surface to form lines that electrically isolate one solar cell from the next. In one embodiment, a 5.7 m$^2$ substrate laser scribe module, available from Applied Materials, Inc., is used to accurately scribe the desired regions of the device substrate 303. In one embodiment, the laser scribe process performed during step 120 uses a 532 nm wavelength pulsed laser to pattern the material disposed on the device substrate 303 to isolate the individual cells that make up the solar cell 300. As shown in FIG. 3E, in one embodiment, the trench 381C is formed in the first p-i-n junction 320 and back contact layer 350 by use of a laser scribing process.

Next, the device substrate 303 is transported to the quality assurance module 222 in which step 122, or quality assurance and/or shunt removal steps, are performed on the device substrate 303 to assure that the devices formed on the substrate surface meet a desired quality standard and in some cases correct defects in the formed device. In step 122, a probing device is used to measure the quality and material properties of the formed solar cell device by use of one or more substrate contacting probes.

In one embodiment, the quality assurance module 222 projects a low level of light at the p-i-n junction(s) of the solar cell and uses the one more probes to measure the output of the cell to determine the electrical characteristics of the formed solar cell device(s). If the module detects a defect in the formed device, it can take corrective actions to fix the defects in the formed solar cells on the device substrate 303. In one embodiment, if a short or other similar defect is found, it may be desirable to create a reverse bias between regions on the substrate surface to control and or correct one or more of the defectively formed regions of the solar cell device. During the correction process the reverse bias generally delivers a voltage high enough to cause the defects in the solar cells to be corrected. In one example, if a short is found between supposedly isolated regions of the device substrate 303 the magnitude of the reverse bias may be raised to a level that causes the conductive elements in areas between the isolated regions to change phase, decompose, or become altered in some way to eliminate or reduce the magnitude of the electrical short.

In one embodiment of the process sequence 100, the quality assurance module 222 and factory automation system are used together to resolve quality issues found in a formed device substrate 303 during the quality assurance testing. In one case, a device substrate 303 may be sent back upstream in the processing sequence to allow one or more of the fabrication steps to be re-performed on the device substrate 303 (e.g., back contact isolation step (step 120)) to correct one or more quality issues with the processed device substrate 303.

Next, the device substrate 303 is optionally transported to the substrate sectioning module 224 in which a substrate sectioning step 124 is used to cut the device substrate 303 into a plurality of smaller device substrates 303 to form a plurality of smaller solar cell devices. In one embodiment of step 124, the device substrate 303 is inserted into substrate sectioning module 224 that uses a CNC glass cutting tool to accurately cut and section the device substrate 303 to form solar cell devices that are a desired size. In one embodiment, the device substrate 303 is inserted into the sectioning module 224 that uses a glass scribing tool to accurately score the surface of the device substrate 303. The device substrate 303 is then broken along the scored lines to produce the desired size and number of sections needed for the completion of the solar cell devices.

In one embodiment, steps 102-122 can be configured to use equipment that is adapted to perform process steps on large device substrates 303, such as 2200 mm×2600 mm×3 mm glass device substrates 303, and steps 124 onward can be adapted to fabricate various smaller sized solar cell devices with no additional equipment required. In another embodiment, step 124 is positioned in the process sequence 100 prior to step 122 so that the initially large device substrate 303 can be sectioned to form multiple individual solar cells that are then tested and characterized one at a time or as a group (i.e., two or more at a time). In this case, steps 102-121 are configured to use equipment that is adapted to perform process steps on large device substrates 303, such as 2200 mm×2600 mm×3 mm glass substrates, and steps 124 and 122 onward are adapted to fabricate various smaller sized modules with no additional equipment required.

Referring back to FIGS. 1 and 2, the device substrate 303 is next transported to the seamer/edge deletion module 226 in which a substrate surface and edge preparation step 126 is used to prepare various surfaces of the device substrate 303 to prevent yield issues later on in the process. In one embodiment of step 126, the device substrate 303 is inserted into seamer/edge deletion module 226 to prepare the edges of the device substrate 303 to shape and prepare the edges of the device substrate 303. Damage to the device substrate 303 edge can affect the device yield and the cost to produce a usable solar cell device. In another embodiment, the seamer/edge deletion module 226 is used to remove deposited material from the edge of the device substrate 303 (e.g., 10 mm) to provide a region that can be used to form a reliable seal between the device substrate 303 and the backside glass (i.e., steps 134-136 discussed below). Material removal from the edge of the device substrate 303 may also be useful to prevent electrical shorts in the final formed solar cell.

In one embodiment, a grinding wheel is used to grind the deposited material from the edge regions of the device substrate 303. In another embodiment, dual grinding wheels are used to remove the deposited material from the edge of the device substrate 303. In yet another embodiment, grit blasting or laser ablation techniques are used to remove the deposited material from the edge of the device substrate 303. In one embodiment, one or more grinding wheels are preferred over blasting techniques in order to reduce the amount of potentially contaminating particles that may be introduced by grit blasting. In one aspect, the seamer/edge deletion module 226 is used to round or bevel the edges of the device substrate 303 by use of shaped grinding wheels, angled and aligned belt sanders, and/or abrasive wheels.

Next the device substrate 303 is transported to the pre-screen module 228 in which optional pre-screen steps 128 are performed on the device substrate 303 to assure that the devices formed on the substrate surface meet a desired quality standard. In step 128, a light emitting source and probing device are used to measure the output of the formed solar cell device by use of one or more substrate contacting probes. If the module 228 detects a defect in the formed device it can take corrective actions or the solar cell can be scrapped.

Next the device substrate 303 is transported to the cleaning module 230 in which step 130, or a pre-lamination substrate cleaning step, is performed on the device substrate 303 to remove any contaminants found on the surface of the substrates 303 after performing steps 122-128. Typically, the cleaning module 230 uses wet chemical scrubbing and rinsing steps to remove any undesirable contaminants found on the substrate surface after performing the cell isolation step. In one embodiment, a cleaning process similar to the processes described in step 106 is performed on the substrate 303 to remove any contaminants on the surface(s) of the substrate 303.

Next the substrate 303 is transported to a bonding wire attach module 231 in which a bonding wire attach step 131 is performed on the substrate 303. Step 131 is used to attach the various wires/leads required to connect various external electrical components to the formed solar cell 300. The bonding wire attach module 231 is an automated wire bonding tool that reliably and quickly forms the numerous interconnects required to produce large solar cells 300 in the production line 200.

In one embodiment, the bonding wire attach module 231 is used to form the side-buss 355 (FIG. 3C) and cross-buss 356 on the formed back contact region. In this configuration, the side-buss 355 may comprise a conductive material that can be affixed, bonded, and/or fused to the back contact layer 350 in the back contact region to form a robust electrical contact. In one embodiment, the side-buss 355 and cross-buss 356 each comprise a metal strip, such as copper tape, a nickel coated silver ribbon, a silver coated nickel ribbon, a tin coated copper ribbon, a nickel coated copper ribbon, or other conductive material that can carry current delivered by the solar cell 300 and that can be reliably bonded to the back contact layer 350 in the back contact region. In one embodiment, the metal strip is between about 2 mm and about 10 mm wide and between about 1 mm and about 3 mm thick.

The cross-buss 356, which is electrically connected to the side-buss 355 at junctions, can be electrically isolated from the back contact layer(s) 350 of the solar cell 300 by use of an insulating material 357, such as an insulating tape. The ends of each of the cross-busses 356 generally have one or more leads 362 that are used to connect the side-buss 355 and the cross-buss 356 to the electrical connections found in a junction box 370, which is used to connect the formed solar cell 300 to other external electrical components. A more detailed description of an exemplary bonding wire attach module 231 is presented below in the section entitled, "Bonding Wire Attach Module and Processes."

In the next step, step 132, a bonding material 360 (FIG. 3D) and "back glass" substrate 361 are prepared for delivery into the solar cell formation process (i.e., process sequence 100). The preparation process is performed in the glass lay-up module 232, which comprises a material preparation module 232A, a glass loading module 232B, and a glass cleaning module 232C. The back glass substrate 361 is bonded onto the device substrate 303 formed in steps 102-130 above by use of a laminating process (step 134 discussed below). In one embodiment of step 132, a polymeric material is prepared to be placed between the back glass substrate 361 and the deposited layers on the device substrate 303 to form a hermetic seal to prevent the environment from attacking the solar cell during its life.

Referring to FIG. 2, step 132 comprises a series of sub-steps in which a bonding material 360 is prepared in the material preparation module 232A, the bonding material 360 is then placed over the device substrate 303, the back glass substrate 361 is loaded into the loading module 232B and washed by the cleaning module 232C, and the back glass substrate 361 is then placed over the bonding material 360 and the device substrate 303.

In one embodiment, the material preparation module 232A is adapted to receive the bonding material 360 in a sheet form and perform one or more cutting operations to provide a bonding material, such as Polyvinyl Butyral (PVB) or Ethylene Vinyl Acetate (EVA) sized to form a reliable seal between the backside glass and the solar cells formed on the device substrate 303. In general, when using bonding materials 360 that are polymeric, it is desirable to control the temperature (e.g., 16-18° C.) and relative humidity (e.g., RH 20-22%) of the solar cell production line 200 where the bonding material 360 is stored and integrated into the solar cell device to assure that the attributes of the bond formed in the bonding module 234 are repeatable and the dimensions of the polymeric material are stable. It is generally desirable to store the bonding material prior to use in temperature and humidity controlled area (e.g., T=6-8° C.; RH=20-22%).

The tolerance stack up of the various components in the bonded device (Step 134) can be an issue when forming large solar cells. Therefore, accurate control of the bonding material properties and tolerances of the cutting process assure that a reliable hermetic seal is formed. In one embodiment, PVB may be used to advantage due to its UV stability, moisture resistance, thermal cycling, good US fire rating, compliance with Intl Building Code, low cost, and reworkable thermoplastic properties.

In one part of step 132, the bonding material 360 is transported and positioned over the back contact layer 350, the side-buss 355 (FIG. 3C), and the cross-buss 356 (FIG. 3C) elements of the device substrate 303 using an automated robotic device. The device substrate 303 and bonding material 360 are then positioned to receive a back glass substrate 361, which can be placed thereon by use of the same automated robotic device used to position the bonding material 360, or a second automated robotic device.

In one embodiment, prior to positioning the back glass substrate 361 over the bonding material 360, one or more preparation steps are performed to the back glass substrate 361 to assure that subsequent sealing processes and final solar product are desirably formed. In one case, the back glass substrate 361 is received in a "raw" state where the edges, overall size, and/or cleanliness of the substrate 361 are not well controlled. Receiving "raw" substrates reduces the cost to prepare and store substrates prior to forming a solar device and thus reduces the solar cell device cost, facilities costs, and production costs of the finally formed solar cell device. In one embodiment of step 132, the back glass substrate 361 surfaces and edges are prepared in a seaming module (e.g., seamer 204) prior to performing the back glass substrate cleaning step. In the next sub-step of step 132, the back glass substrate 361 is transported to the cleaning module 232C in which a substrate cleaning step is performed on the substrate 361 to remove any contaminants found on the surface of the substrate 361. Common contaminants may include materials deposited on the substrate 361 during the substrate forming process (e.g., glass manufacturing process) and/or during shipping of the substrates 361. Typically, the cleaning module 232C uses wet chemical scrubbing and rinsing steps to remove any undesirable contaminants as discussed above. The prepared back glass substrate 361 is then positioned over the bonding material and the device substrate 303 by use of an automated robotic device.

Next the device substrate 303, the back glass substrate 361, and the bonding material 360 are transported to the bonding module 234 in which step 134, or lamination steps are performed to bond the backside glass substrate 361 to the device substrate formed in steps 102-130 discussed above. In step 134, a bonding material 360, such as Polyvinyl Butyral (PVB) or Ethylene Vinyl Acetate (EVA), is sandwiched between the backside glass substrate 361 and the device substrate 303. Heat and pressure are applied to the structure to form a bonded and sealed device using various heating elements and other devices found in the bonding module 234. The device substrate 303, the back glass substrate 361, and the bonding material 360 thus form a composite solar cell structure 304 (FIG. 3D) that at least partially encapsulates the active regions of the solar cell device. In one embodiment, at least one hole formed in the back glass substrate 361 remains at least partially uncovered by the bonding material 360 to allow portions of the cross-buss 356 or the side-buss 355 to remain exposed so that electrical connections can be made to these regions of the solar cell structure 304 in future steps (i.e., step 138).

Next the composite solar cell structure 304 is transported to the autoclave module 236 in which step 136, or autoclave steps are performed on the composite solar cell structure 304 to remove trapped gasses in the bonded structure and assure that a good bond is formed during step 134. In step 134, a bonded solar cell structure 304 is inserted in the processing region of the autoclave module where heat and high pressure gases are delivered to reduce the amount of trapped gas and improve the properties of the bond between the device substrate 303, back glass substrate, and bonding material 360. The processes performed in the autoclave are also useful to assure that the stress in the glass and bonding layer (e.g., PVB layer) are more controlled to prevent future failures of the hermetic seal or failure of the glass due to the stress induced during the bonding/lamination process. In one embodiment, it may be desirable to heat the device substrate 303, back glass substrate 361, and bonding material 360 to a temperature that causes stress relaxation in one or more of the components in the formed solar cell structure 304.

Next the solar cell structure 304 is transported to the junction box attachment module 238 in which junction box attachment steps 138 are performed on the formed solar cell structure 304. The junction box attachment module 238, used during step 138, is used to install a junction box 370 (FIG. 3C) on a partially formed solar cell. The installed junction box 370 acts as an interface between the external electrical components that will connect to the formed solar cell, such as other solar cells or a power grid, and the internal electrical connections points, such as the leads, formed during step 131. In one embodiment, the junction box 370 contains one or more junction box terminals 371, 372 so that the formed solar cell can be easily and systematically connected to other external devices to deliver the generated electrical power.

Next the solar cell structure 304 is transported to the device testing module 240 in which device screening and analysis steps 140 are performed on the solar cell structure 304 to assure that the devices formed on the solar cell structure 304 surface meet desired quality standards. In one embodiment, the device testing module 240 is a solar simulator module that is used to qualify and test the output of the one or more formed solar cells. In step 140, a light emitting source and probing device are used to measure the output of the formed solar cell device by use of one or more automated components adapted to make electrical contact with terminals in the junction box 370. If the module detects a defect in the formed device it can take corrective actions or the solar cell can be scrapped.

Next the solar cell structure 304 is transported to the support structure module 241 in which support structure mounting steps 141 are performed on the solar cell structure 304 to provide a complete solar cell device that has one or more mounting elements attached to the solar cell structure 304 formed using steps 102-140 to a complete solar cell device that can easily be mounted and rapidly installed at a customer's site.

Next the solar cell structure 304 is transported to the unload module 242 in which step 142, or device unload steps are performed on the substrate to remove the formed solar cells from the solar cell production line 200.

In one embodiment of the solar cell production line 200, one or more regions in the production line are positioned in a clean room environment to reduce or prevent contamination from affecting the solar cell device yield and useable lifetime. In one embodiment, as shown in FIG. 2, a class 10,000 clean room space 250 is placed around the modules used to perform steps 108-118 and steps 130-134.

Bonding Wire Attach Module and Processes

Figure 5:
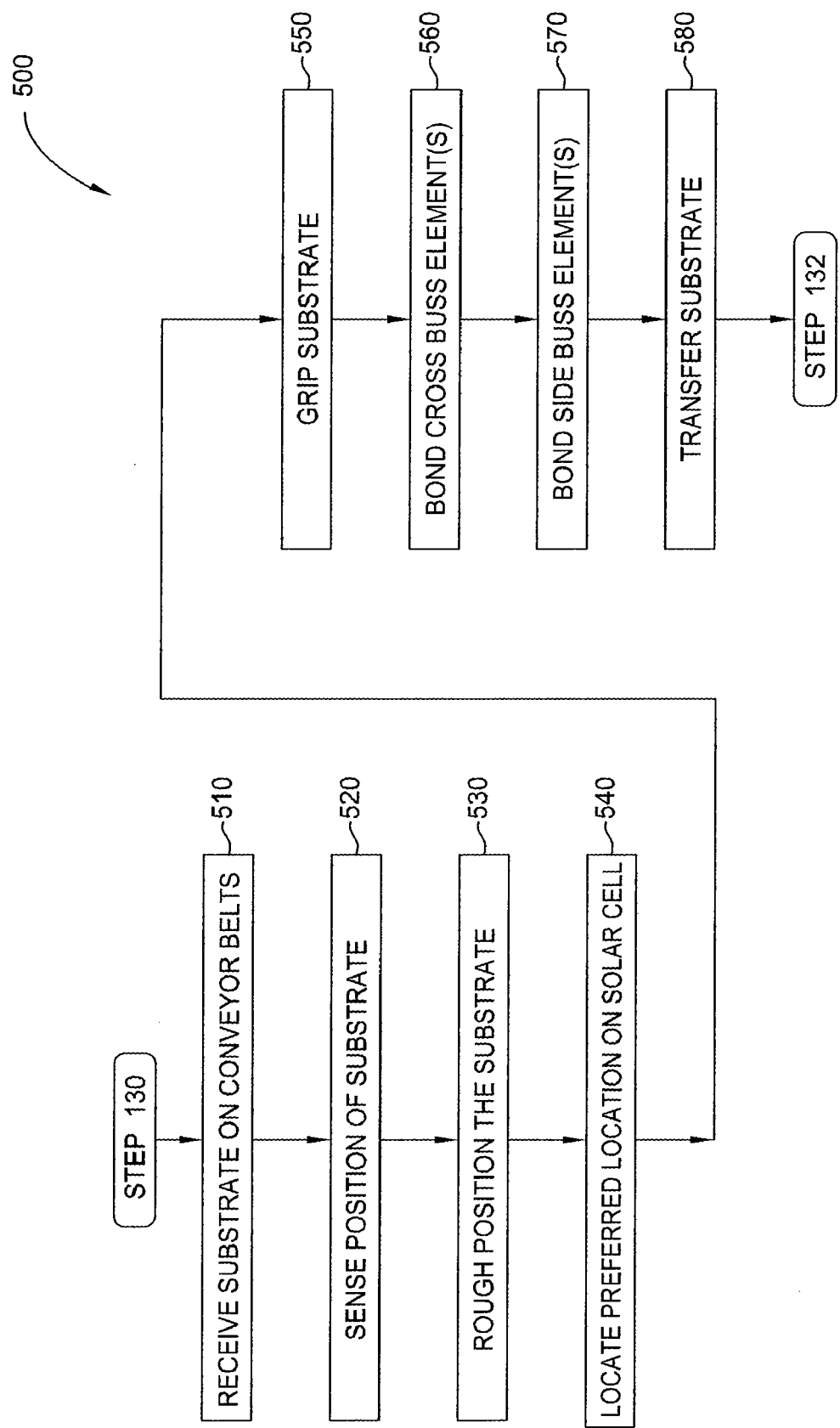
FIG. 5 illustrates one embodiment of a processing sequence for forming an electrical connection on a device substrate during the production of a solar cell.

As noted above, during the bonding wire attach step 131, one or more process steps, such as shown in processing sequence 500 in FIG. 5, are performed to form the electrical leads 362 (FIG. 3C) that will allow the fully formed solar cell 300 to be easily and systematically connected to external devices for delivering solar generated electrical power.

Figure 4A:
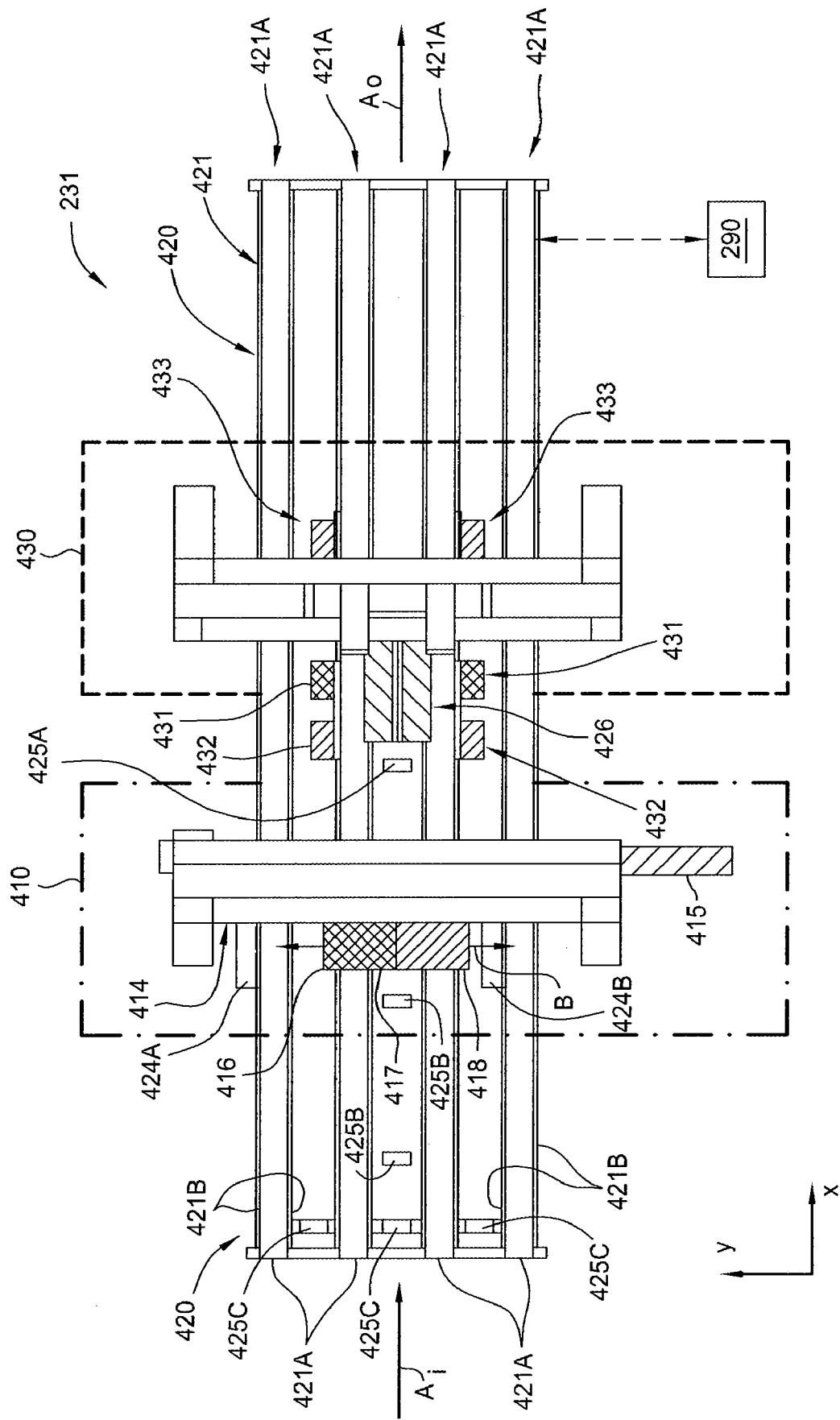
FIG. 4A is a schematic plan view of a bonding wire attach module according to one embodiment of the present invention.
Figure 4B:
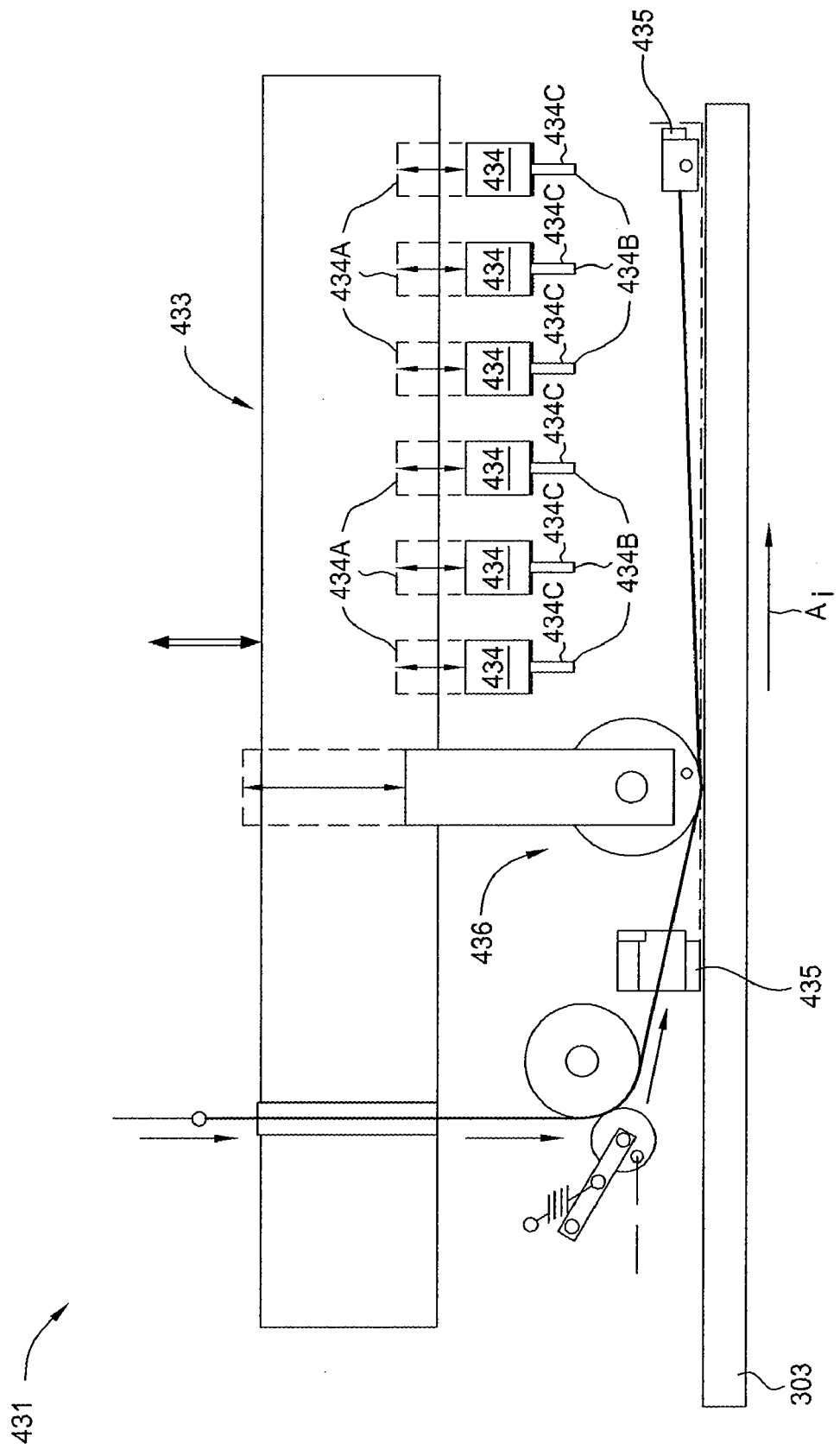
FIG. 4B is a side view of a portion of a side-buss depositing element and a soldering module according to one embodiment of the present invention.

FIGS. 4A-4B illustrate one embodiment of the bonding wire attach module 231 for performing the processing sequence 500 detailed below. FIG. 4A is a schematic plan view of the bonding wire attach module 231 according to one embodiment of the present invention. In one embodiment, the bonding wire attach module 231 includes a substrate handling system 420, a cross-buss assembly 410, and a side-buss assembly 430 controlled by the system controller 290.

In general operation, a device substrate 303 is transferred into the bonding wire attach module 231 following the path $A_i$. The device substrate 303 then passes through the cross-buss assembly 410 and the side-buss assembly 430 via the substrate handling system 420. The device substrate 303 then exits the bonding wire attach module 231 following path $A_o$.

In one embodiment, the substrate handling system 420 includes a support truss, or support structure (not shown), that is positioned beneath and is adapted to support and retain the various components used to perform the processing sequence 500, detailed below. In one embodiment, the substrate handling system 420 includes a conveyor system 421 that has a plurality of conventional automated conveyor belts 421A for positioning and transferring the device substrate 303 within the bonding wire attach module 231 in a controlled and automated fashion.

In one embodiment, the conveyor system 421 also includes a plurality of frictionless support elements 421B that are mounted to the support structure and positioned adjacent to the automated conveyor belts 421A to allow a device substrate 303 to be supported, moved, and positioned with minimum contact and abrasion of the device substrate surfaces during device substrate alignment and/or the bonding processes. In one embodiment, the conventional automated conveyor belts 421A are mounted on a moveable structure that allows the device substrate 303 to be disposed on and/or removed from the frictionless support elements 421B by the movement of the automated conveyor belts 421A. The frictionless support elements 421B may comprise a gas receiving plenum that has one or more plenum surfaces that have a plurality of holes formed therein.

In operation, the holes are adapted to deliver a gas (e.g., air, $N_2$) from the gas receiving plenum to a surface of the device substrate 303 that is disposed over the plenum surface. The gas delivered by the holes is thus used to "frictionlessly" support the device substrate 303 over the plenum surface so that the device substrate 303 can be moved and aligned without contacting or abrading the surface of the device substrate 303. The use of the frictionless support elements 421B also allows for a more precise control of the movement of the device substrate 303 versus just using the automated conveyor belt system 421 since the often small X-direction and Y-direction movements of a large device substrate 303 during alignment (steps 530 and 540 detailed below) are sensitive to frictional forces resisting the alignment.

In one embodiment, the substrate handling system 420 also includes various aligning and gripping members for aligning, positioning, and/or moving the device substrate 303 within the bonding wire attach module 231. In one embodiment, the substrate handling system 420 includes a leading edge rough stop 425A, one or more trailing edge rough stops 425B, and one or more gripping elements 425C for retaining and moving the device substrate 303 during processing. In one embodiment, the leading edge rough stop 425A, the one or more trailing edge rough stops 425B, and the one or more gripping elements 425C are each moveable in a vertical (Z-direction) and X-Y directions (FIG. 4A) to actively position and angularly align the retained device substrate 303 during processing.

In one embodiment, various configurations of leading edge rough stops 425A and trailing edge rough stops 425B are used to position each size of device substrate 303 that is processed in the bonding wire attach module 231. That is, a size appropriate trailing edge stop 425B may be used in conjunction with a leading edge rough stop 425A as each different sized device substrate 303 is processed by the bonding wire attach module 231. For example, one trailing edge stop 425B may be appropriate for a full sized device substrate, such as 2200 mm×2600 mm×3 mm, and another trailing edge stop 425B may be appropriate for a quarter sized panel, such as 1100 mm×1300×3 mm.

In one embodiment, the substrate handling system 420 also includes one or more datum finding elements, such as one or more Y-axis datum elements 424A and pusher elements 424B for aligning an edge of the device substrate 303 to a known position within the bonding wire attach module 231. In operation, after the leading edge of the device substrate 303 has been located by a physical stop and/or one or more sensors contained in the leading edge rough stops 425A, the device substrate 303 is pressed against the Y-axis datum elements 424A by the pusher elements 424B to align the device substrate 303 to a known Y position within the bonding wire attach module 231.

In one embodiment, the substrate handling system 420 also includes a vision system 426 for accurately aligning active regions of the device substrate 303 to elements in the cross-buss assembly 410 and the side-buss assembly 430 so that the cross-buss 356 (FIG. 3C) and the side-buss 355 can be accurately positioned on the device substrate 303. In one embodiment, the vision system 426 and the system controller 290 are adapted to locate one or more features on the device substrate 303 by scanning the device substrate with the vision system 426. In one embodiment, the vision system 426 includes at least one camera as well as other electronic components for locating, storing, and communicating the position of features on the device substrate 303.

For example, the vision system 426 can be used to locate various scribed features (e.g., laser scribe in steps 108, 114, and 120) formed in the layers deposited on the device substrate 303. Due to tolerances in the device substrate 303 received in step 102, the position of the scribed features can vary relative to the edges of the device substrate 303. Such variability can affect the placement of the cross-buss 356 and side-buss 355 as well as the overall device yield of the solar cell formation process 100. Once the desirable scribed features on the device substrate 303 are located by the vision system 426, the device substrate 303 can be repositioned by use of the substrate handling system 420 to allow the cross-buss 356 and the side-buss 355 to be placed in a desired position relative to the scribed features.

Still referring to FIG. 4A, the cross-buss assembly 410 is generally used to deposit the cross-buss 356 and insulating material 357 (FIG. 3C) on the back contact layer 350 of the device substrate 303. In one embodiment, the cross-buss assembly 410 includes a motion assembly 414, a material feed assembly 416, and a cross-buss feed assembly 415. The motion assembly 414 is used to position the dispensing assembly 916 in a cross direction "B" (i.e., ±Y-direction) so that the cross-buss 356 can be deposited on the surface of the back contact layer 350.

In one embodiment, the motion assembly 414 includes a conventional actuator that is used to control the movement of the material feed assembly 416 by use of commands sent from the system controller 290. To prevent the cross-buss 356 elements from shorting the active regions of the solar cell 300 the insulating material 357, which has electrical insulating properties, is placed under the cross-buss 356.

In one embodiment, an insulating material dispensing assembly 417 receives insulating material from the material feed assembly 416 and dispenses the insulating material onto the back contact layer 350 of the device substrate 303. In one embodiment, a cross-buss dispensing assembly 418 receives the cross-buss 356 from the cross-buss feed assembly 415 and dispenses the cross-buss onto the insulating material. In one embodiment, the insulating material 357 has an adhesive material deposited on two sides so that one side can be affixed to the surface of the device substrate 303 by use of one or more application elements, such as a roller, and the cross-buss 356 can be affixed to the other side of the insulating material 357 by use of the application element(s). In another embodiment, the insulating material 357 has an adhesive material deposited on only one side so that it can be affixed to the surface of the device substrate via the application element(s), and the cross-buss 356 has an adhesive material deposited on one side so that it can be bonded to the insulating material 357 surface via the application element(s). In one embodiment, the side of the insulating material 357 having the adhesive is protected prior to application via a protective strip, which is removed as the insulating material 357 is dispensed onto the back contact layer 350 of the device substrate 303.

In one embodiment, the side-buss assembly 430 has two dispensing modules 432, two side-buss depositing elements 431, and two soldering modules 433 that are used to substantially simultaneously form the two side-busses 355 (FIG. 3C) on the device substrate 303 as the device substrate 303 is moved in the direction "$A_i$" through the bonding wire attach module 231. In operation, each dispensing module 432 is used to dispense a flux material on desired regions of the back contact layer 350. Next, the side-buss depositing elements 431 substantially simultaneously deposit a side-buss 355 on opposing edges of the device substrate 303 over a portion of the dispensed flux material. The soldering modules 433 then fuse the side-buss 355 to the back contact layer 350 and the cross-buss 356. In one embodiment, multiple discrete solder points 434B (FIG. 4B) are positioned at a desired pitch to fuse regions of the side-buss 355 to the back contact layer 350.

FIG. 4B is a side view of a portion of one of the side-buss depositing elements 431 and the soldering module 433 that illustrates elements used to attach the side-buss 355 to the surface of the device substrate 303 as the device substrate 303 is sequentially indexed, or continually moved, in the direction "$A_i$" according to one embodiment of the present invention. In operation, a length of the side-buss 355 is positioned by use of a feed gripper 435 and roller 436 so that the multiple discrete solder points 434B in the bonding assemblies 434 can locally heat up various points along the length of the side-buss 355 to form a plurality of electrical connections between the side-buss 355 and the back contact layer 350. In one embodiment, six bonding assemblies 434 are vertically positioned to simultaneously bring a plurality of solder points 434B into contact with the side-buss 355 by use of one or more vertical actuators 434A. The use of multiple solder points 434B at once may improve the throughput of the bonding wire attach module 231 since it allows long lengths of the side-buss 355 to be attached at one time. The attachment of long lengths of the side-buss 356 minimizes the affect of the time required to heat up the side-buss 355 and back contact layer 350 to a desired temperature to form a good electrical connection at the each bonded region. The distance between each of the solder points 434B along the direction "$A_i$" may be configured to assure that the electrical resistance in the bonded side-buss 355 will not affect the performance of the formed solar cell 300. In one embodiment, the solder points 434B are spaced between about 10 mm and 50 mm apart. In one embodiment, the soldering module 433 also includes a plurality of cooling nozzles 434C that are positioned to deliver a cooling fluid (e.g., room temperature gas) to each of the bonded regions prior to the solder points 434B being separated from the side-buss 355 surface after performing the bonding process.

In an alternate embodiment, the side-buss assembly 430 uses a conductive adhesive, such as a silver epoxy, rather than solder flux to affix the side-buss 355 to the back contact layer and the cross-buss 356. In such an embodiment, the dispensing modules 432 dispense the conductive adhesive onto desired regions of the back contact layer 350. Next, the side-buss depositing elements 431 substantially simultaneously deposit a side-buss 355 on opposing edges of the device substrate 303 over a portion of the dispensed conductive adhesive. In one embodiment, the conductive adhesive is cured at an elevated temperature, such as from between about 80° C. and about 150° C. for a time period from between about 80 seconds and about 180 seconds. In one embodiment, the curing may be performed under pressure.

Referring to FIGS. 1, 4A-4B, and 5, in step 131a series of sub-sequence steps, or the processing sequence 500, are used to complete the bonding wire attach process. As detailed above, embodiments of the invention may include a method and a device for electrically equipping a solar cell 300 such that the junction box 370 may be attached to external devices for reception of solar generated power. FIG. 5 illustrates one embodiment of the processing sequence 500 for forming an electrical connection on a device substrate 303 during the production of a solar cell 300 according to the processing sequence 100. The configuration of the processing sequence, number of processing steps, order of processing steps, and arrangement of processing sequence 500 within the processing sequence 100 illustrated herein are not intended to be limiting to the scope of the invention described herein.

The processing sequence 500 generally begins at step 510 in which one or more device substrates 303 are moved to an input region of the bonding wire attach module 231 by use of a robotic device so that the automated conveyor belts 421A can receive and position the device substrate 303. The automated conveyor belts 421A may also be adapted to receive a plurality of device substrates 303 that have been processed following steps 102-130. Movement of the device substrates 303 can be controlled by commands sent to one or more driving mechanisms coupled to the automated conveyor belts 421A from the system controller 290.

In step 520, the device substrate 303 may be moved along the automated conveyor belts 421A until the leading edge of the device substrate 303 is sensed by a moveable hard stop element and an optical sensor or a position sensor contained within the leading edge rough stop 425A. The leading edge is generally the edge of the device substrate 303 that is perpendicular to the direction of motion "$A_i$" and is first to advance into range of the leading edge rough stop 435A (FIG. 4A).

In step 530, the device substrate 303 may be lowered onto a gas cushion created by gas flowing through the plurality of holes formed in the plurality of frictionless support elements 421B. In one embodiment, the device substrate 303 is lowered onto the gas cushion by use of one or more actuators adapted to raise and lower the automated conveyor belts 421A. Once the device substrate 303 is positioned on the gas cushion, it may then be aligned to the Y-axis datum elements 424A by use of the pusher elements 424B. In one embodiment, servo motors in the Y-axis datum elements 424A and the pusher elements 424B are controlled to position the device substrate in a desired location within the bonding wire attach module 231.

Next, a size appropriate trailing edge rough stop 425B may be raised to engage the trailing edge of the device substrate 303. In one embodiment, the trailing edge rough stop 425B urges the device substrate against the leading edge rough stop 425A. In one embodiment, servo control of the Y-axis datum elements 424A, the trailing edge rough stop 425B, and the leading edge rough stop 425A allows the device substrate 303 to be positioned in the X and Y directions such that fine adjustments or corrections can be made in subsequent steps.

In step 540, an accurate location and alignment may be attained between features formed on the device substrate 303 and the automated components in the bonding wire attach module 231. In one embodiment, the X-direction, Y-direction, and angular alignment of the scribed trenches 381C (FIG. 3C) are aligned relative to the automation components in the bonding wire attach module 231. The X-direction, Y-direction, and angular alignment of the device substrate 303 may be adjusted by use of the data collected by the vision system 426 and control signals sent to the servo controlled Y-axis datum elements 424A, the trailing edge rough stop 425B, and the leading edge rough stop 425A by the system controller 290.

In step 550, once the device substrate 303 has been aligned, the device substrate 303 may then be grasped and retained by the gripping elements 425C. In one embodiment, once the gripping elements 425C have grasped a portion of the device substrate 303, the Y-axis datum elements 424A, the trailing edge rough stop 425B, and the leading edge rough stop 425A are disengaged from the device substrate 303 and are retracted. In one embodiment, the gripping elements 425C are then used to move the device substrate 303 along a known path through the bonding wire attach module 231 so that the cross-buss 356 and side-buss 355 elements can be accurately affixed in subsequent steps. In one embodiment, moving of the gripping elements 425C is controlled by commands received from the system controller 290. In one embodiment, the vision system 426 is used to recheck the position of the device substrate 303 after the gripping elements 425C have grasped a portion of the device substrate 303 to assure that the device substrate 303 is still in desirable alignment.

In step 560, the insulating material 357 and cross-busses 356 may be positioned in desired locations on the back contact layer 350 of the device substrate 303 via commands received from the system controller 290. In one embodiment, one or more lengths of the insulating material 357 and two cross-busses 356 are positioned on the surface of the device substrate 303 to form leads 362 that are used to deliver current from the side-busses 355 to the junction box 370 (FIG. 3C).

In one embodiment, step 560 comprises two major steps. First, the insulating material 357 is placed between the cross-busses 356 and the back contact layer 350 to prevent the cross-busses 356 from shorting out the active regions of the solar cell 300. In this step, the insulating material dispensing assembly 417 dispenses one or more desired lengths of the insulating material 357 on the surface of the device substrate 303. Second, the cross-buss dispensing assembly 418 dispenses one or more desired lengths of the cross-buss 356 on the surface of the insulating material 357.

In one embodiment, the process of dispensing the cross-buss 356 includes pressing the cross-buss 356, which has an adhesive disposed on one side, onto the surface of the insulating material 357 and then cutting the cross-buss 356 when a desired length has been positioned thereon. As shown in FIG. 3C, this step may require two lengths of cross-buss 356 material and one or more lengths of insulating material 357 to be affixed to the device substrate 303 to allow the formation of the two electrically isolated leads 362 that are separately connected to the active regions of the device substrate through each side-buss 355. In one embodiment, the placement and physical configuration of the cross-buss 356 and the insulating material 357 can be automatically adjusted solar-cell-to-solar-cell by use of commands received from the system controller 290.

In step 570, the side-busses 355 may be positioned and bonded to the back contact layer 350 and the cross-busses 356 via commands received from the system controller 290. In one embodiment, each side-buss 355 is incrementally bonded to the back contact layer 350 by first applying the flux material or conductive adhesive to the surface of the back contact layer 350 via the dispensing module 432, then applying each side-buss 355 over the flux material or conductive adhesive via the side-buss depositing element 431, and then forming discrete electrical connection points between the side-buss 355 and the back contact layer 350 by use of the bonding assemblies 434 in the case of soldering or heat and/or pressure in the case of conductive adhesion.

In one embodiment, incremental lengths of both side-busses 355 are simultaneously attached to opposing edges of the device substrate 303 by advancing the device substrate 303 in a desired direction "$A_i$" (FIGS. 4A and 4B) and then bonding the side-buss 355 to the back contact layer 350 by the application of heat delivered by the soldering points 434B. In this configuration, the incremental lengths can be set to provide a regular spacing of the solder points 434B along the length of the side-buss 355.

In step 580, the gripping elements 425C release the device substrate 303 and the automated conveyor belts 421A are raised to receive the device substrate 303 from the frictionless support elements 421B. After the device substrate 303 has been received by the automated conveyor belts 421A the gas flowing to the frictionless support elements 421B is turned off and the automated conveyor belts 421A move the device substrate 303 toward the next module in the processing sequence 100. Movement of the device substrate 303 can be controlled by commands sent to one or more driving mechanisms coupled to the automated conveyor belts 421A from the system controller 290.

While the foregoing is directed to embodiments of the present invention, other and further embodiments of the invention may be devised without departing from the basic scope thereof, and the scope thereof is determined by the claims that follow.

What is claimed:

1. A bonding wire attach module, comprising:
   a substrate handling system having a conveyor system configured to receive a solar cell substrate into the bonding wire attach module and transfer the solar cell substrate out of the bonding wire attach module;
   a positioning system having a vision system comprising a camera, wherein the vision system is configured to scan the solar cell substrate and send signals regarding the position of one or more features on the solar cell substrate to a system controller;
   a cross-buss assembly having a motion assembly configured to receive commands from the system controller and position cross-buss material across a back contact surface of the solar cell substrate such that the cross-buss material is insulated from the back contact surface of the solar cell substrate; and
   a side-buss assembly configured to position and affix side-buss material to the back contact surface of the solar cell substrate along an edge region of the solar cell substrate, wherein the side-buss material electrically connects the edge region of the solar cell substrate to the cross-buss material.

2. The module of claim 1, wherein the cross-buss assembly further comprises an insulating material feed assembly configured to feed an insulating material to the back contact surface of the solar cell substrate and a cross-buss material feed assembly configured to feed the cross-buss material to the insulating material, wherein the motion assembly is configured to position the insulating material feed assembly and the cross-buss material feed assembly via commands from the system controller.

3. The module of claim 2, wherein the cross-buss assembly further comprises an insulating material dispensing assembly configured to receive the insulating material from the insulating material feed assembly and affix the insulating material to the back contact surface of the solar cell substrate and a cross-buss material dispensing assembly configured to receive the cross-buss material from the cross-buss material feed assembly and affix the cross-buss material to the insulating material disposed on the solar cell substrate.

4. The module of claim 1, wherein the side-buss assembly comprises a material dispensing module and a side-buss depositing element configured to feed the side-buss material to the back contact surface of the solar cell substrate and position the side-buss material along the edge region of the solar cell substrate.

5. The module of claim 4, wherein the material dispensing module is configured to dispense a conductive adhesive onto the back contact surface of the solar cell substrate and the side-buss depositing element is configured to position the side-buss material onto the conductive adhesive and cure the conductive adhesive.

6. The module of claim 4, wherein the material dispensing module is configured to dispense a flux material onto the back contact surface of the solar cell substrate and the side-buss depositing element is configured to position the side-buss material onto the flux material, and wherein the side-buss assembly further comprises a soldering module.

7. The module of claim 6, wherein the soldering module comprises a plurality of bonding assemblies configured to fuse the side-buss material to the back contact surface of the solar cell substrate.

8. The module of claim 7, wherein each bonding assembly comprises a soldering point for contacting the side-buss material and an actuator for advancing the soldering point toward the side-buss material and retracting the soldering point away from the side-buss material.

9. The module of claim 1, wherein the positioning system further comprises:
a plurality of frictionless support elements positioned adjacent the conveyor system;
a leading edge rough stop configured to position the leading edge of the solar cell substrate as it is advanced within the bonding wire attach module;
a trailing edge rough stop configured to position the trailing edge of the solar cell substrate as it is advanced within the bonding wire attach module;
a datum element configured to position a side edge of the solar cell substrate;
a pusher element configured to urge the solar cell substrate against the datum element; and
a gripper element configured to grasp and advance the solar cell substrate.

10. The module of claim 9, wherein the frictionless support elements comprise a gas receiving plenum having one or more plenum surfaces with a plurality of holes formed therein and a gas flowing therethrough.

11. The module of claim 10, wherein the gripper element is configured to receive commands from the system controller for positioning the solar cell substrate based on signals sent by the vision system.

12. A bonding wire attach module, comprising:
a substrate handling system having a plurality of conveyor belts configured to receive a solar cell substrate into the bonding wire attach module, advance the solar cell substrate within the bonding wire attach module, and transfer the solar cell substrate out of the bonding wire attach module;
a positioning system having a vision system with at least one camera, wherein the vision system is configured to scan the solar cell substrate and send signals to a system controller regarding the position of one or more features on the solar cell substrate;
a cross-buss assembly, comprising:
a material feed assembly configured to feed an insulating material toward a back contact surface of the solar cell substrate;
a material dispense assembly configured to receive the insulating material from the material feed assembly and affix the insulating material to the back contact surface of the solar cell substrate;
a cross-buss material feed assembly configured to feed the cross-buss material toward the back contact surface of the solar cell substrate;
a cross-buss material dispense assembly configured to receive the cross-buss material from the cross-buss material feed assembly and affix the cross-buss material to the insulating material; and
a motion assembly configured to receive commands from the system controller and position the material dispense assembly and the cross-buss material dispense assembly; and
a side-buss assembly comprising two dispensing modules and two side-buss material depositing elements, wherein each side-buss material depositing element is configured to feed a respective length of side-buss material toward the back contact surface of the solar cell substrate and position the side-buss material along opposing edge regions of the solar cell substrate such that each length of side-buss material electrically connects the respective edge region of the solar cell substrate to the cross-buss material.

13. The module of claim 12, wherein the positioning system further comprises:
a plurality of frictionless support elements positioned adjacent the plurality of conveyor belts;
a leading edge rough stop configured to position the leading edge of the solar cell substrate;
a plurality of trailing edge rough stops, each configured to position the trailing edge of a plurality of different sized solar cell substrates;
a datum element configured to position a side edge of the solar cell substrate;
a pusher element configured to urge the solar cell substrate against the datum element; and
a gripper element configured to grasp the solar cell substrate and advance the solar cell substrate within the bonding wire attach module.

14. The module of claim 13, wherein the frictionless support elements comprise a gas receiving plenum having one or more plenum surfaces with a plurality of holes formed therein and a gas flowing through the plurality of holes.

15. The module of claim 14, wherein each dispensing module is configured to dispense a conductive adhesive onto the back contact surface of the solar cell substrate and the side-buss assembly is configured to position each length of side-buss material onto the conductive adhesive and cure the conductive adhesive.

16. The module of claim 14, wherein each dispensing module is configured to dispense a flux material onto the back contact surface of the solar cell substrate and the side-buss assembly is configured to position each length of side-buss material onto the flux material, and wherein the side-buss assembly further comprises a plurality of soldering modules configured to fuse each length of side-buss material to the solar cell substrate.

* * * * *

UNITED STATES PATENT AND TRADEMARK OFFICE
CERTIFICATE OF CORRECTION

PATENT NO. : 8,065,784 B2  
APPLICATION NO. : 12/394616  
DATED : November 29, 2011  
INVENTOR(S) : Lu et al.

Page 1 of 1

It is certified that error appears in the above-identified patent and that said Letters Patent is hereby corrected as shown below:

In the Background of the Invention:

Column 1, Line 37, please delete "(pc-Si)" and insert --($\mu$c-Si)-- therefor.

Signed and Sealed this  
Twenty-first Day of February, 2012

David J. Kappos  
*Director of the United States Patent and Trademark Office*